(12) United States Patent
Sardesai et al.

(10) Patent No.: US 9,263,457 B2
(45) Date of Patent: Feb. 16, 2016

(54) CROSS-COUPLING OF GATE CONDUCTOR LINE AND ACTIVE REGION IN SEMICONDUCTOR DEVICES

(71) Applicant: International Business Machines Corporation, Armonk, NY (US)

(72) Inventors: Viraj Y. Sardesai, Poughkeepsie, NY (US); Robert C. Wong, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 66 days.

(21) Appl. No.: 14/146,063

(22) Filed: Jan. 2, 2014

(65) Prior Publication Data

US 2014/0113417 A1 Apr. 24, 2014

Related U.S. Application Data

(62) Division of application No. 13/207,102, filed on Aug. 10, 2011, now Pat. No. 8,853,700.

(51) Int. Cl.
| | |
|---|---|
| *H01L 27/11* | (2006.01) |
| *H01L 29/66* | (2006.01) |
| *H01L 27/02* | (2006.01) |
| *H01L 27/092* | (2006.01) |
| *H01L 21/768* | (2006.01) |
| *H01L 29/51* | (2006.01) |

(52) U.S. Cl.
CPC ...... *H01L 27/1104* (2013.01); *H01L 21/76895* (2013.01); *H01L 27/0211* (2013.01); *H01L 27/092* (2013.01); *H01L 29/66545* (2013.01); *H01L 29/517* (2013.01); *Y10S 257/903* (2013.01); *Y10S 257/904* (2013.01)

(58) Field of Classification Search
None
See application file for complete search history.

(56) References Cited

U.S. PATENT DOCUMENTS

| | | |
|---|---|---|
| 4,740,479 A | 4/1988 | Neppl et al. |
| 5,124,774 A | 6/1992 | Godinho et al. |

(Continued)

OTHER PUBLICATIONS

Ootsuka, F. et al., "A Novel 0.20 um Full CMOS SRAM Cell Using Stacked Cross Couple with Enhanced Soft Error Immunity" IEEE International Electron Devices Meeting, IEDM (Dec. 6-9, 1998) pp. 205-208.

(Continued)

*Primary Examiner* — Whitney T Moore
*Assistant Examiner* — Scott R Wilson
(74) *Attorney, Agent, or Firm* — Scully, Scott, Murphy & Presser, P.C.

(57) ABSTRACT

Cross-coupling between a gate conductor and an active region of a semiconductor substrate is provided by forming a gate dielectric layer on the semiconductor substrate and lithographically patterning the gate dielectric layer to form opening therein over a portion of the active region at which electrical contact with the gate conductor is desired. After implanting electrical dopants, a gate conductor layer is deposited and patterned. A remaining portion of the gate conductor layer includes an integral conductor structure, which includes a first portion overlying a gate dielectric over an active region and a second portion contacting the semiconductor material of the same active region or a different active region. The gate dielectric layer can be deposited within gate cavities in planarization dielectric material layer in a replacement gate scheme, or can be deposited on planar surfaces of active regions and/or shallow trench isolation structures in a gate first processing scheme.

12 Claims, 25 Drawing Sheets

(56) References Cited

U.S. PATENT DOCUMENTS

| | | | |
|---|---|---|---|
| 5,618,749 A * | 4/1997 | Takahashi et al. | 438/384 |
| 5,668,051 A | 9/1997 | Chen et al. | |
| 5,700,707 A | 12/1997 | Lee | |
| 6,242,775 B1 | 6/2001 | Noble | |
| 6,285,078 B1 | 9/2001 | Nelson | |
| 6,750,494 B1 | 6/2004 | Prall | |
| 6,919,647 B2 | 7/2005 | Hackler, Sr. et al. | |
| 6,921,711 B2 | 7/2005 | Cabral, Jr. et al. | |
| 7,074,666 B2 | 7/2006 | Furukawa et al. | |
| 7,420,243 B2 | 9/2008 | Kim et al. | |
| 7,619,281 B2 | 11/2009 | Seo et al. | |
| 7,678,658 B2 | 3/2010 | Yang et al. | |
| 2005/0180198 A1 * | 8/2005 | Hayashi et al. | 365/154 |
| 2007/0007571 A1 | 1/2007 | Lindsay et al. | |
| 2008/0048297 A1 * | 2/2008 | Yang et al. | 257/586 |
| 2010/0038692 A1 * | 2/2010 | Chuang et al. | 257/298 |

OTHER PUBLICATIONS

Yang, H.S. et al., "Scaling of 32nm Low Power SRAM with High-K Metal Gate" IEEE International Electron Devices Meeting, IEDM (Dec. 17-19, 2008) 4 pages.

* cited by examiner

CROSS-COUPLING OF GATE CONDUCTOR LINE AND ACTIVE REGION IN SEMICONDUCTOR DEVICES

CROSS REFERENCE TO RELATED APPLICATION

This application is a divisional of U.S. patent application Ser. No. 13/207,102, filed on Aug. 10, 2011, the entire content and disclosure of which is incorporated herein by reference.

BACKGROUND

The present disclosure relates to semiconductor structures, and particularly to metal-oxide-semiconductor field effect transistors (MOSFETs) having a cross-coupling between a gate conductor and an active region and methods of manufacturing the same.

Many semiconductor devices require a cross-coupling between an active region of a substrate and a gate conductor. For example, static random access memory (SRAM) devices have a cross coupling between active regions of a substrate and gate conductors through metal contact bars that overlie and contact both a gate conductor and an active region. As the dimensions of SRAM devices shrink in each successive technology node, the spacing between an adjacent pair of active regions and the spacing between adjacent gate conductors have shrunk at a faster rate than the width of a gate conductor. This approach has resulted in an SRAM design having relatively small contact via structures for cross-couple gate conductors and active regions. However, controlling lithographic processes and etch processes for forming such contact via structures have become exceedingly challenging for small scale devices.

Use of local interconnect for SRAM devices makes the problem of controlling lithographic processes and etch processes even more challenging because the contact window for such contact via structures is defined by a window between gate conductor lines, and thus, such contact via structures are expected to result in poor yield and/or reliability. A structure and method for providing a reliable contact structure without resorting to a contact via is desired for scaled down devices.

SUMMARY

On a semiconductor substrate including active regions separated by shallow trench isolation structures, cross-coupling between a gate conductor and an active region of the semiconductor substrate is provided by forming a gate dielectric layer on the semiconductor substrate and lithographically patterning the gate dielectric layer to form an opening therein over a portion of the active region at which electrical contact with the gate conductor is desired. A gate conductor layer is deposited and patterned. A remaining portion of the gate conductor layer includes an integral conductor structure, which includes a first portion overlying a gate dielectric over an active region and a second portion contacting the semiconductor material of the same active region or a different active region. The gate dielectric layer can be deposited within gate cavities in a planarization dielectric material layer in a replacement gate scheme, or it can be deposited on planar surfaces of active regions and/or shallow trench isolation structures in a gate first processing scheme.

According to an aspect of the present disclosure, a semiconductor structure is provided, which includes: a gate dielectric contacting a portion of an active region including a semiconductor material and located in a substrate; and a gate conductor of unitary construction including a first gate conductor portion that overlies the gate dielectric and a second gate conductor portion that contacts a semiconductor surface, wherein the semiconductor surface is selected from a surface of the active region and a surface of another active region located in the substrate.

According to another aspect of the present disclosure, a method of forming a semiconductor structure is provided, which includes: forming a gate cavity by removing a disposable gate structure selective to a planarization dielectric layer on a semiconductor substrate, wherein at least one surface of at least one active region is exposed within the gate cavity; depositing a gate dielectric layer within the gate cavity; removing a portion of the gate dielectric layer within the gate cavity from above one of the at least one active region; and filling the gate cavity with a conductive material and planarizing the conductive material, wherein a gate conductor contacting a gate dielectric, which is a remaining portion of the gate dielectric layer, and a semiconductor surface of the one of the at least one active region fills the gate cavity.

According to yet another aspect of the present disclosure, another method of forming a semiconductor structure is provided, which includes: forming a gate dielectric layer over at least one active region in a semiconductor substrate; removing a portion of the gate dielectric layer from above one of the at least one active region; and depositing and patterning a conductive material layer to form a gate conductor, wherein the gate conductor contacts a gate dielectric, which is a remaining portion of the gate dielectric layer, and a semiconductor surface of the one of the at least one active region.

BRIEF DESCRIPTION OF THE SEVERAL VIEWS OF THE DRAWINGS

Throughout the drawings herein, figures with the same figure numeral represent a structure at the same stage of a manufacturing process. Figures with a suffix "A" are top-down views. Figures with a suffix "B" are vertical cross-sectional views of the structure in the figure having the same figure numeral and the suffix "A" along the vertical plane B-B'.

FIG. 12C is a vertical cross-sectional view of the second exemplary semiconductor structure of FIGS. 12A and B along the vertical plane C-C' in FIG. 12A.

DETAILED DESCRIPTION

Figure 1A:
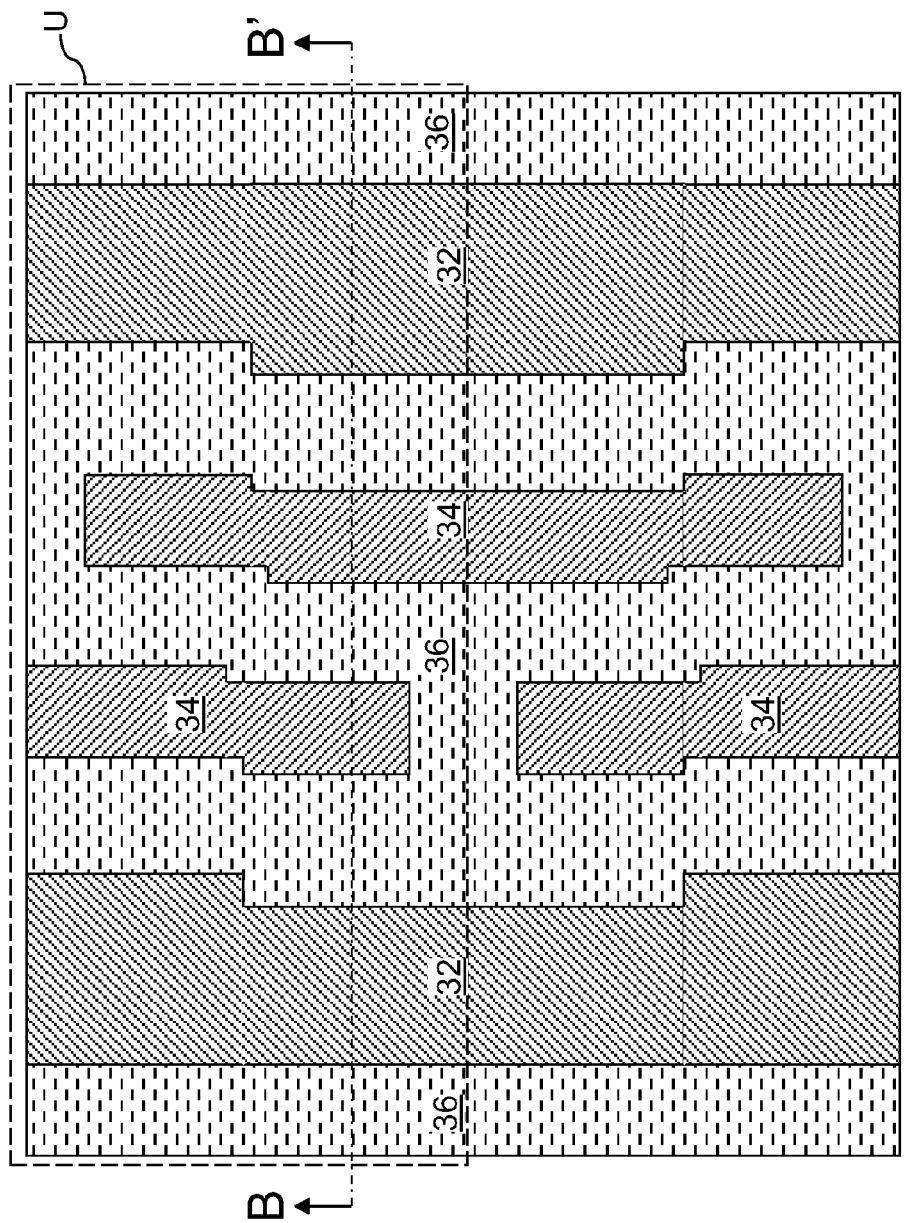
FIGS. 1A and 1B illustrate a first exemplary semiconductor structure after formation of shallow trench isolation structures according to a first embodiment of the present disclosure.

As stated above, the present disclosure, which relates to metal-oxide-semiconductor field effect transistors (MOSFETs) having a cross-coupling between a gate conductor and an active region and methods of manufacturing the same, will now be described in detail with accompanying figures. Like and corresponding elements mentioned herein and illustrated in the drawings are referred to by like reference numerals. The drawings are not necessarily drawn to scale.

Figure 1B:
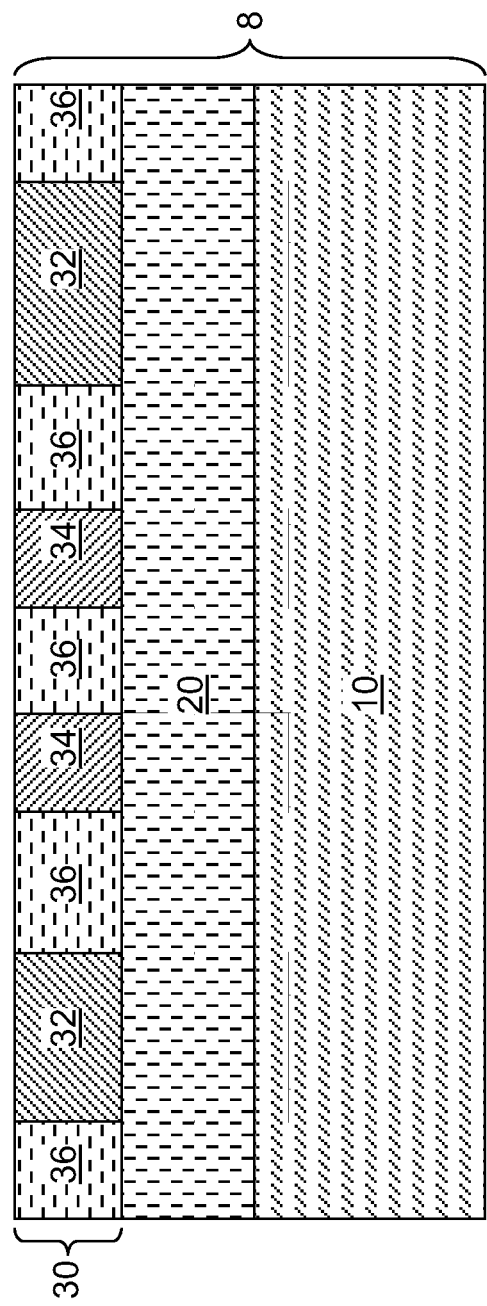

Referring to FIGS. 1A and 1B, a first exemplary semiconductor structure according to a first embodiment of the present disclosure includes a semiconductor substrate 8 that includes at least a semiconductor layer 30. The semiconductor substrate 8 can be a semiconductor-on-insulator (SOI) substrate having a vertical stack, from bottom to top, of a handle substrate 10, a buried insulator layer 20, and the semiconductor layer 30, which is a top semiconductor layer. Alternatively, the semiconductor substrate 8 can be a bulk substrate in which the semiconductor layer 30 contiguously extends from the topmost surface of the semiconductor substrate 8 to the bottommost surface of the semiconductor substrate 8. In one embodiment, the semiconductor layer 30 includes a single crystalline semiconductor material throughout.

Shallow trenches are patterned at least in the upper portion of the semiconductor layer 30 employing methods known in the art. If the semiconductor substrate 8 is an SOI substrate, the shallow trenches can be formed through the semiconductor layer 30. The shallow trenches are filled with a dielectric material and planarized to form shallow trench isolation structures 36. The remaining semiconductor material in the semiconductor layer 30 constitutes active regions, which can include first active regions 32 and second active regions 34. In one embodiment, the first active regions 32 have a doping of a first conductivity type, which can be p-type or n-type, and the second active regions 34 have a doping of a second conductivity type, which is the opposite of the first conductivity type.

The first exemplary semiconductor structure can be configured to form any type of complementary metal oxide semiconductor (CMOS) device. For example, the first exemplary semiconductor structure can be configured to form p-type field effect transistors and n-type field effect transistors.

In one embodiment, the first exemplary semiconductor structure can include static random access memory (SRAM) cells. The area of an SRAM cell, or a unit cell of an SRAM array, is illustrated by a rectangle labeled "U" in FIG. 1A and subsequent figures including top-down views of the first exemplary semiconductor structure. An SRAM cell includes four n-type field effect transistors and two p-type field effect transistors, and two pairs of serially connected p-type field effect transistor and n-type field effect transistor are provided between a power supply node and electrical ground node. In each serial connection, the drain of a p-type field effect transistor is directly connected to the drain of an n-type field effect transistor, i.e., without any intervening electrical component between the two drains. The gates of one pair of a first p-type field effect transistor and a first n-type field effect transistor in one serial connection are cross-coupled to the drains of a second p-type field effect transistor and a second n-type field effect transistor in the other serial connection, and vice versa. In this embodiment, the first active regions 32 have a p-type doping, and the second active regions 34 have an n-type doping at this step.

Figure 2A:
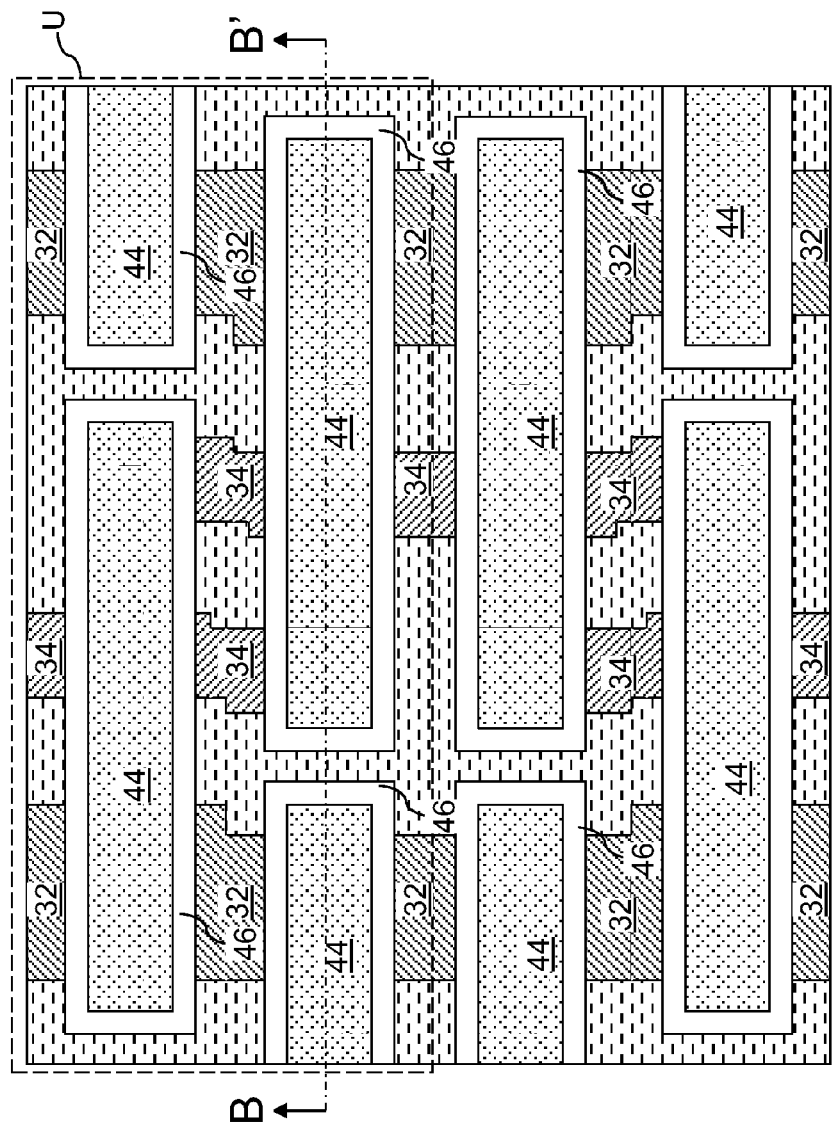
FIGS. 2A and 2B illustrate the first exemplary semiconductor structure after formation of disposable gate stacks and dielectric spacers according to the first embodiment of the present disclosure.
Figure 2B:
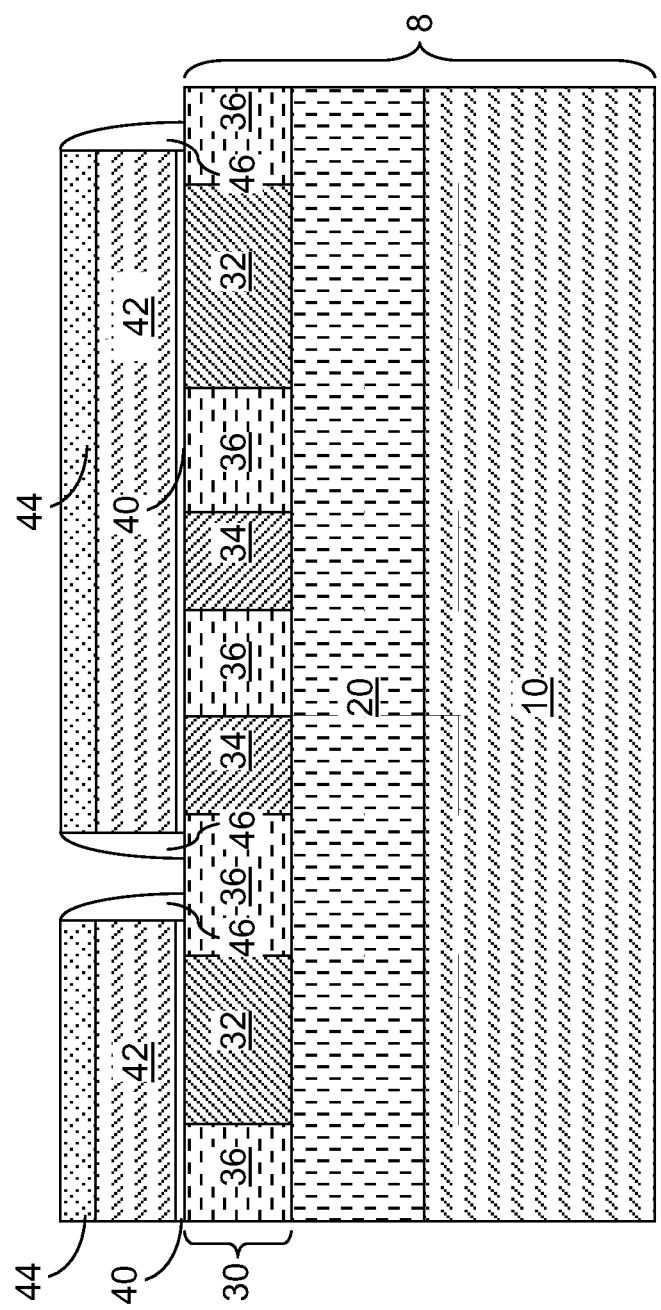

Referring to FIGS. 2A and 2B, disposable gate stacks and dielectric spacers are formed on the semiconductor substrate 8. The disposable gate stacks can be formed, for example, by forming at least one blanket disposable material layer, applying and lithographically patterning a photoresist over the at least one blanket disposable material layer, and transferring the pattern in the photoresist into the at least one blanket disposable material layer employing the patterned photoresist as an etch mask layer. The at least one blanket disposable material layer may include, for example, a stack, from bottom to top, of a blanket disposable lower dielectric material layer, a blanket disposable semiconductor material layer, and a blanket disposable upper dielectric material layer. The remaining portions of the at least one blanket disposable material layer within each disposable gate stack can include, for example, a disposable lower dielectric 40, a disposable semiconductor material portion 42, and a disposable upper dielectric 44.

Exemplary materials that can be employed for the disposable lower dielectrics 40 include, but are not limited to, silicon oxide, silicon nitride, and silicon oxynitride. Exemplary materials that can be employed for the disposable semiconductor material portions 42 include, but are not limited to, elemental semiconductor materials such as silicon, germanium, and carbon, and compound semiconductor materials such as III-V compound semiconductor materials and II-VI compound semiconductor material, and combinations thereof. Exemplary material that can be employed for the disposable upper dielectrics 44 include, but are not limited to, silicon oxide, silicon nitride, and silicon oxynitride. The total thickness of each disposable gate stack (40, 42, 44) can be from 50 nm to 500 nm, although lesser and greater thicknesses can also be employed. Further, any stack of disposable materials can be employed for the disposable gate stacks provided that the bottommost material of the disposable gate stacks can be removed selective to the semiconductor material of the first and second active regions (32, 34).

Optionally, dopants may be implanted into various portions of the first and second active regions (32, 34) by masked ion implantation, i.e., ion implantation employing a patterned mask that locally blocks the dopants, to form source/drain extension regions (not shown) and/or halo regions (not shown) within the first and second active regions (32, 34) to enhance device performance. A gate spacer 46 including a dielectric material is formed around each disposable gate stack (40, 42, 44), for example, by conformally depositing a dielectric material layer and removing horizontal portions of the dielectric material layer by an anisotropic etch. The remaining vertical portions of the conformal dielectric material layer constitute the gate spacers 46. The dielectric material of the gate spacers 46 can be, for example, silicon oxide, silicon nitride, silicon oxynitride, or a combination thereof. While a single gate spacer is illustrated as the gate spacers 46 in the drawings, each gate spacer 46 can be formed as a set of a plurality of component gate spacers (not shown), which can have the same composition thereamongst or different compositions thereamongst. After each formation of a component gate spacer, dopants of appropriate types can be implanted employing masked ion implantation to form source/drain extension regions (not shown) or source/drain regions (not shown).

Figure 3A:
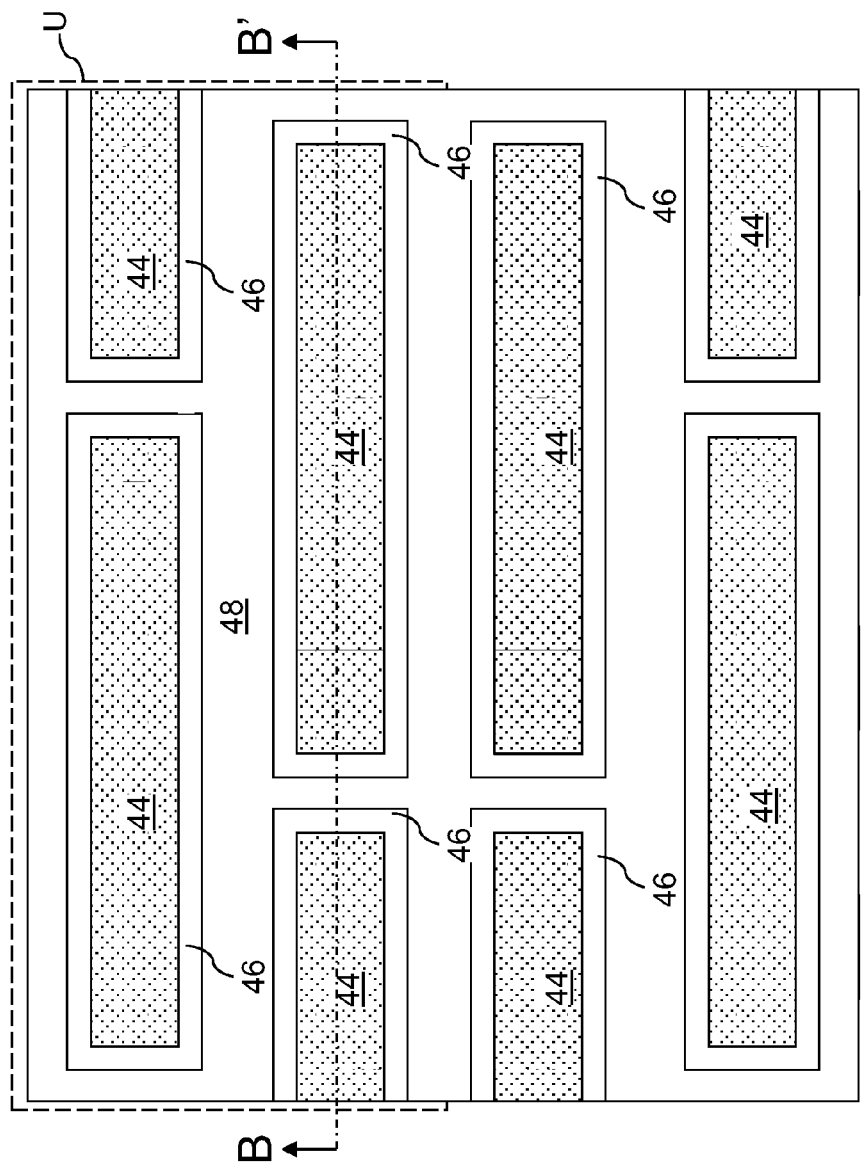
FIGS. 3A and 3B illustrate the first exemplary semiconductor structure after deposition and planarization of a planarization dielectric layer according to the first embodiment of the present disclosure.
Figure 3B:
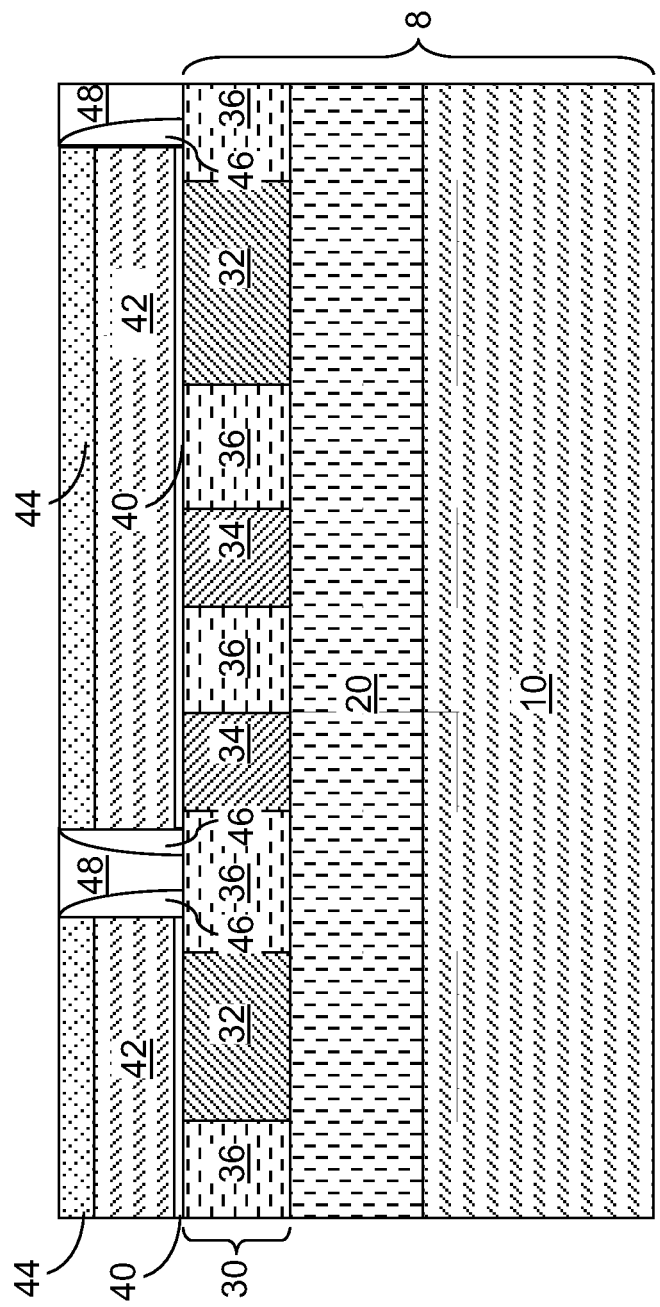

Referring to FIGS. 3A and 3B, a planarization dielectric layer 48 is deposited over the disposable gate stacks (40, 42, 44) and the gate spacers 46. The planarization dielectric layer 48 can be the same dielectric material as, or a different dielectric material from, the material(s) of the gate spacers 46. For example, the gate planarization dielectric layer 48 can include silicon oxide, silicon nitride, organosilicate glass, doped silicate glass, or a combination thereof. The planarization dielectric layer 48 may, or may not be, self-planarizing. The excess portions of the planarization dielectric layer 48 above the topmost surfaces of the disposable gate stacks (40, 42, 44) are removed, for example, by chemical mechanical planarization (CMP), recess etch, or a combination thereof. At the end of the planarization process, the top surfaces of the disposable gate stacks (40, 42, 44) and the top surface of the planarization dielectric layer are coplanar with one another, i.e., located within the same horizontal plane.

Figure 4A:
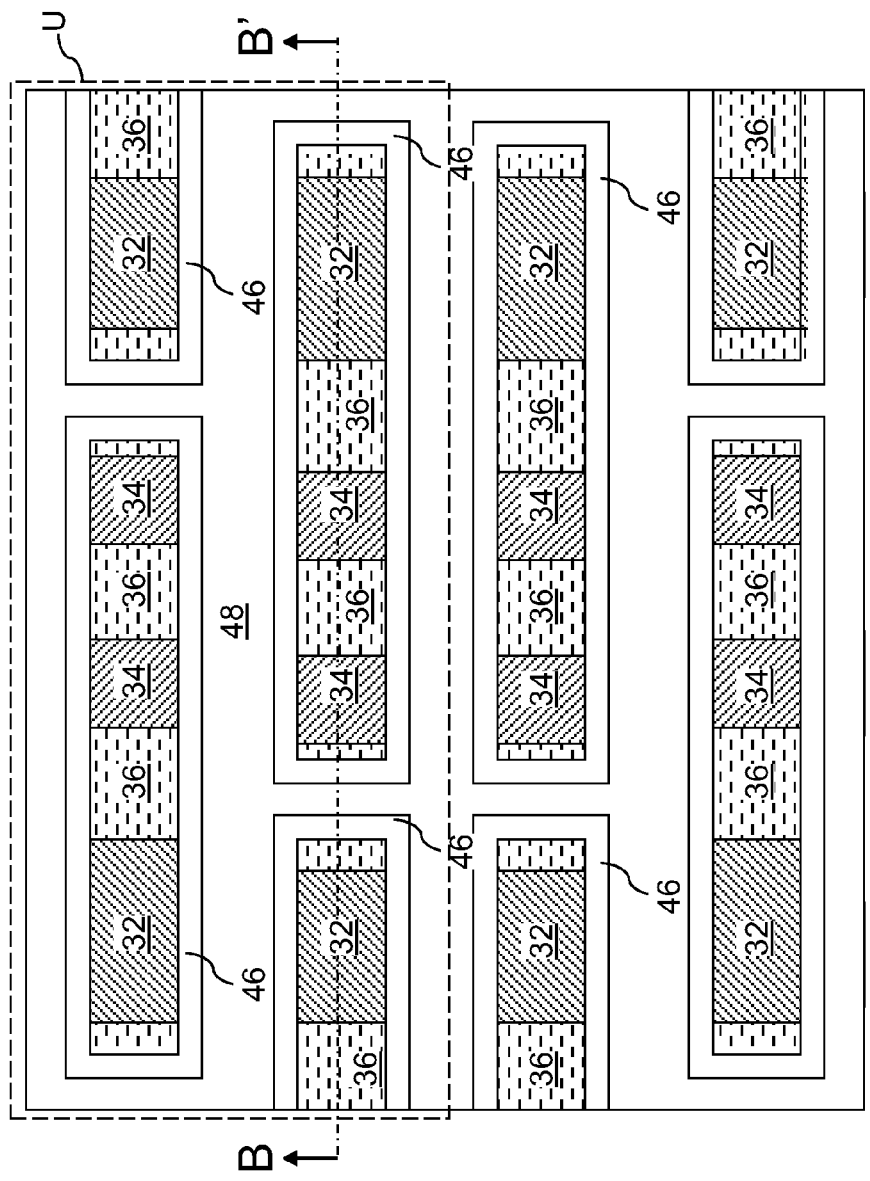
FIGS. 4A and 4B illustrate the first exemplary semiconductor structure after removal of disposable gate structures according to the first embodiment of the present disclosure.
Figure 4B:
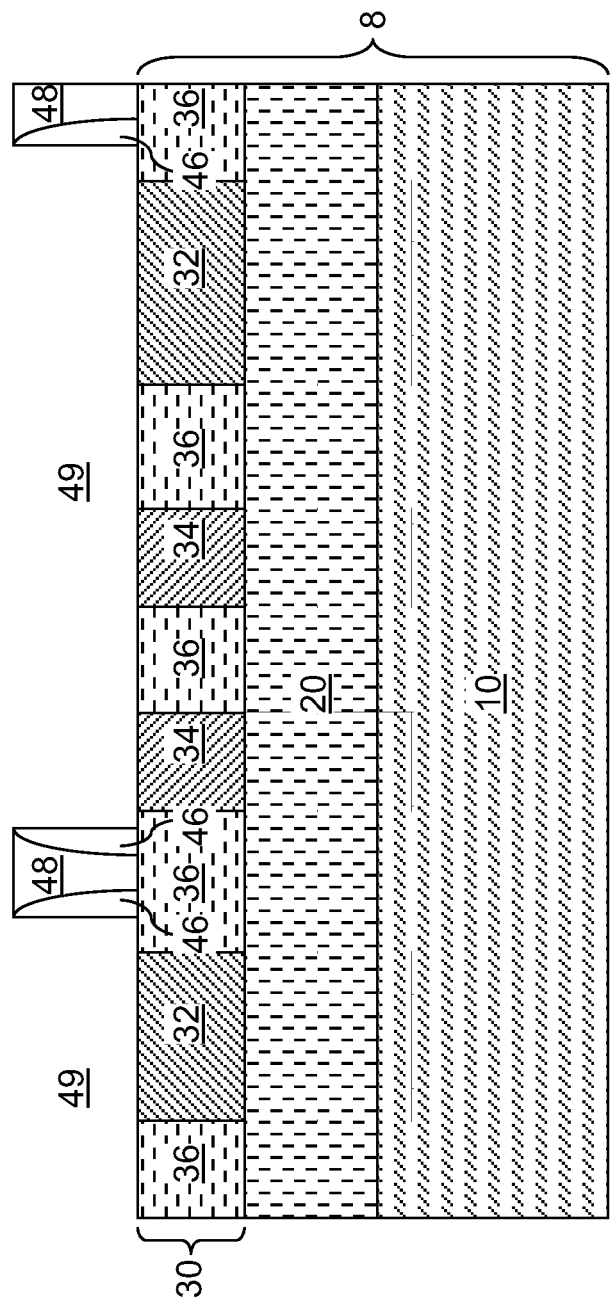

Referring to FIGS. 4A and 4B, the disposable gate structures (40, 42, 44) are removed selective to the dielectric material of the planarization dielectric layer 48 and the semiconductor material of the first and second active regions (32, 34). A gate cavity 49 is formed in each space from which a disposable gate structure (40, 42, 44) is removed. In one embodiment, the disposable gate structures (40, 42, 44) are removed selective to the dielectric material of the gate spacers 46 so that the gate cavities 49 have substantially vertical sidewalls.

At least one surface of at least one active region (32, 34) can be exposed within the gate cavity. For example, each unit cell U of an SRAM array can include two gate cavities 49, in which a semiconductor surface of a first active region 32 and two semiconductor surfaces of two second active regions 34 are exposed, and half of two other gate cavities 49, in which two semiconductor surfaces of two first active regions 32 are exposed. It is noted that the other half of the two other gate cavities 49 belong to other unit cells (not shown). In each gate cavity exposing a semiconductor surface of a first active region 32 and two semiconductor surfaces of two second active regions 34, the exposed semiconductor surface of the first active region 32 corresponds to the channel region of an n-type field effect transistor, the exposed semiconductor surface of a second active region 34 adjacent to the first active region 32 corresponds to the channel region of a p-type field effect transistor, and the exposed semiconductor surface of the other second active region 34 corresponds to the drain of the other p-type field effect transistor.

In general, one or more semiconductor surfaces belonging to one or more active regions (32, 34) can be exposed in each gate cavity 49, and each gate cavity 49 may, or may not, overlie a plurality of active regions (32, 34). If a gate cavity 49 overlies a plurality of active regions (32, 34), the plurality of active regions (32, 34) are laterally spaced by a shallow trench isolation structure 36 at the bottom of the gate cavity 49. Further, a gate cavity that overlies a plurality of active regions (32, 34) may overlie only one type of active regions, i.e., either first active regions 32 or second active regions 34, or may overlie both types of active regions, i.e., at least one first active region 32 and at least one second active region 34.

Figure 5A:
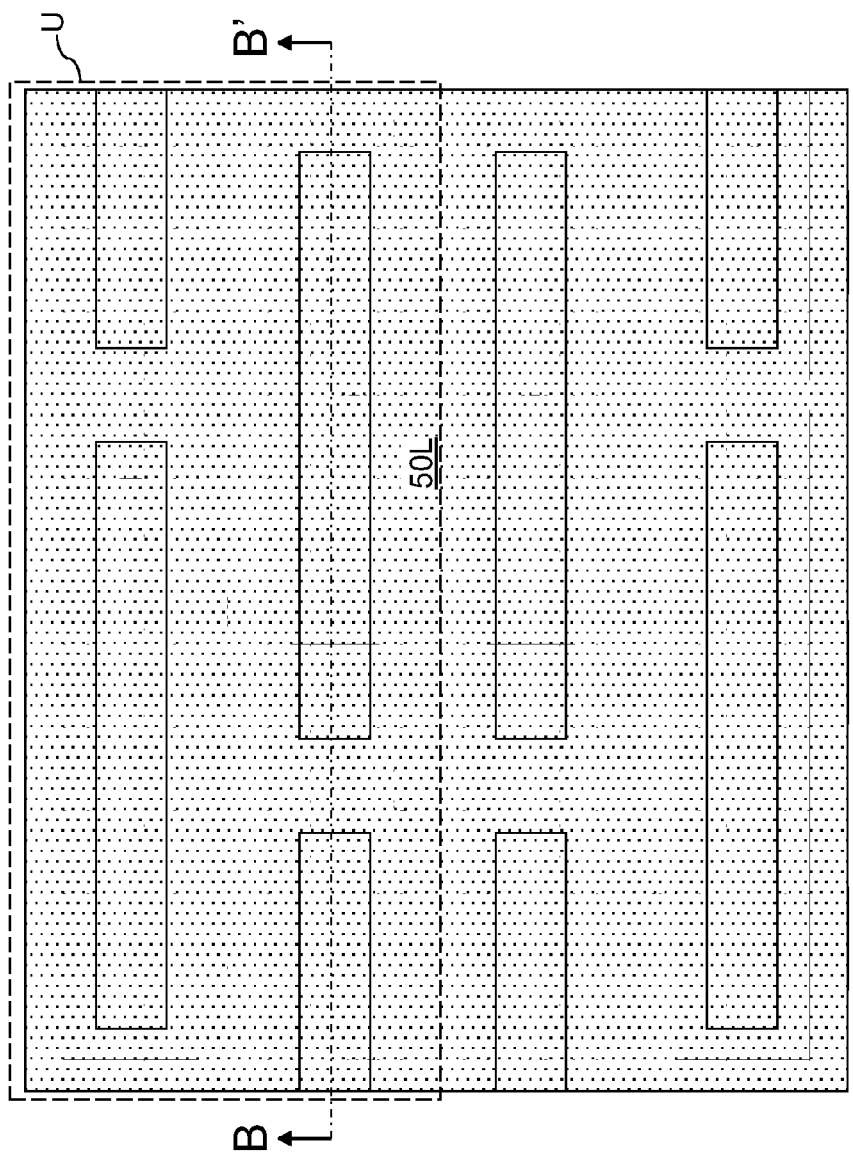
FIGS. 5A and 5B illustrate the first exemplary semiconductor structure after deposition of a gate dielectric layer according to the first embodiment of the present disclosure.
Figure 5B:
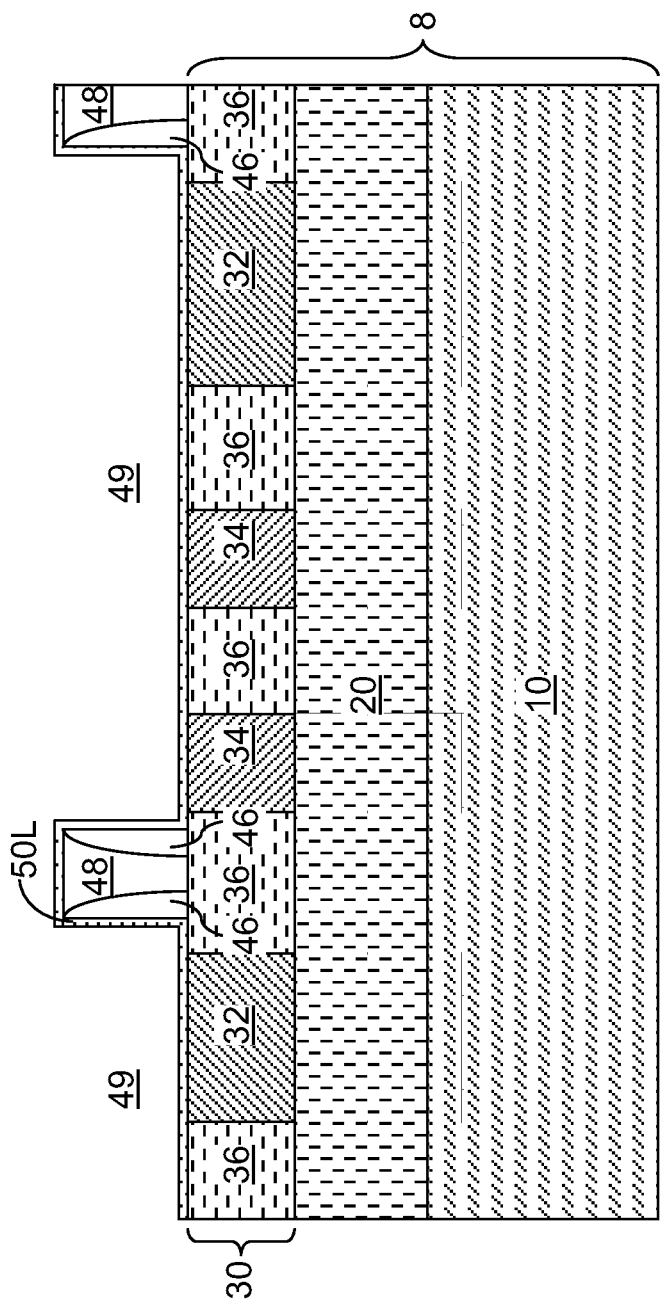

Referring to FIGS. 5A and 5B, a gate dielectric layer 50L is deposited conformally on the top surface of the planarization dielectric layer 48, the inner sidewalls of the gate spacers 46, and the exposed surfaces of the semiconductor layer 30, i.e., the exposed surfaces of the first and second active regions (32, 34) and the shallow trench isolation structures 36. All bottom surfaces and sidewall surfaces of each gate cavity 49 are lined with the gate dielectric layer 50L.

The gate dielectric layer 50L can be a dielectric material including at least one metal and oxygen, and can be a high dielectric constant (high-k) material layer having a dielectric constant greater than 8.0. The gate dielectric layer 50L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L, as measured at horizontal portions, can be from 0.9 nm to 6 nm, and preferably from 1.0 nm to 3 nm. The gate dielectric layer 50L may have an effective oxide thickness on the order of or less than 1 nm.

Figure 6A:
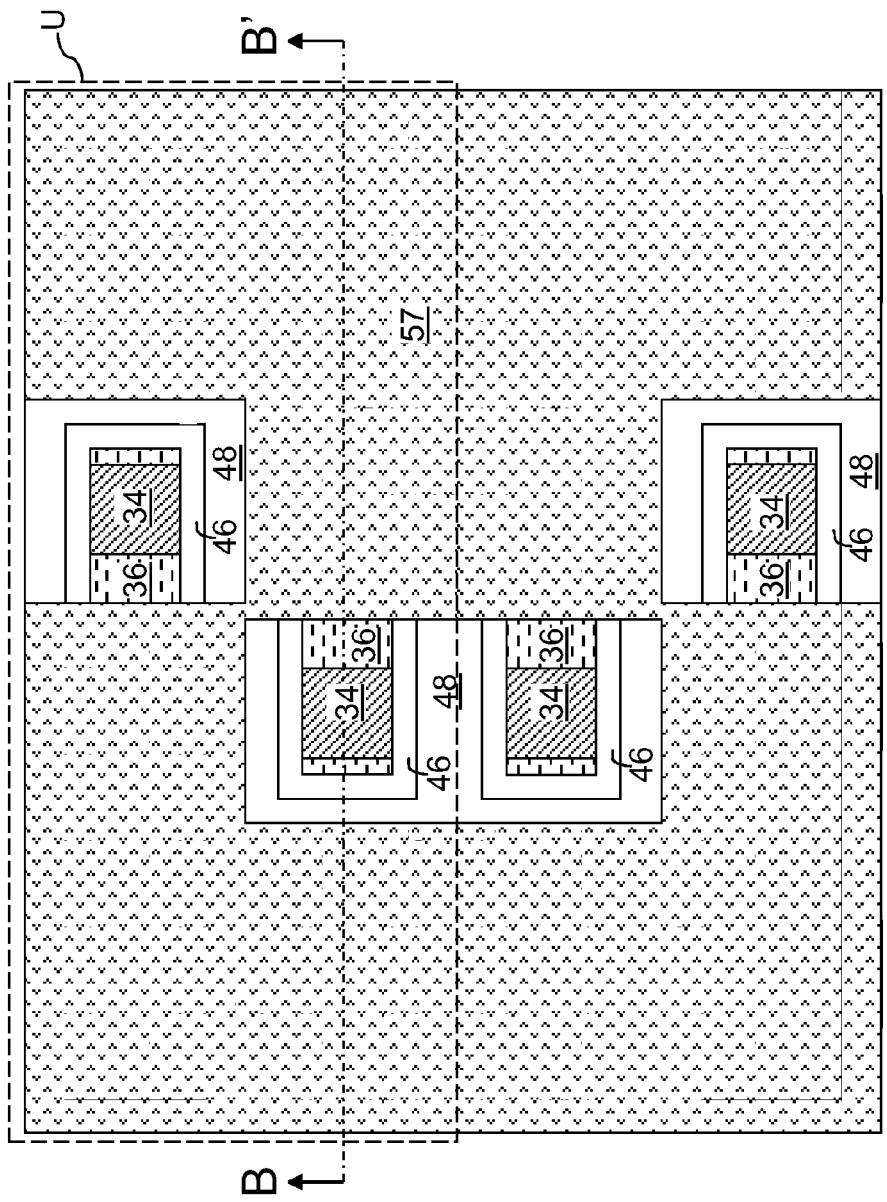
FIGS. 6A and 6B illustrate the first exemplary semiconductor structure after formation of openings in the gate dielectric layer according to the first embodiment of the present disclosure.
Figure 6B:
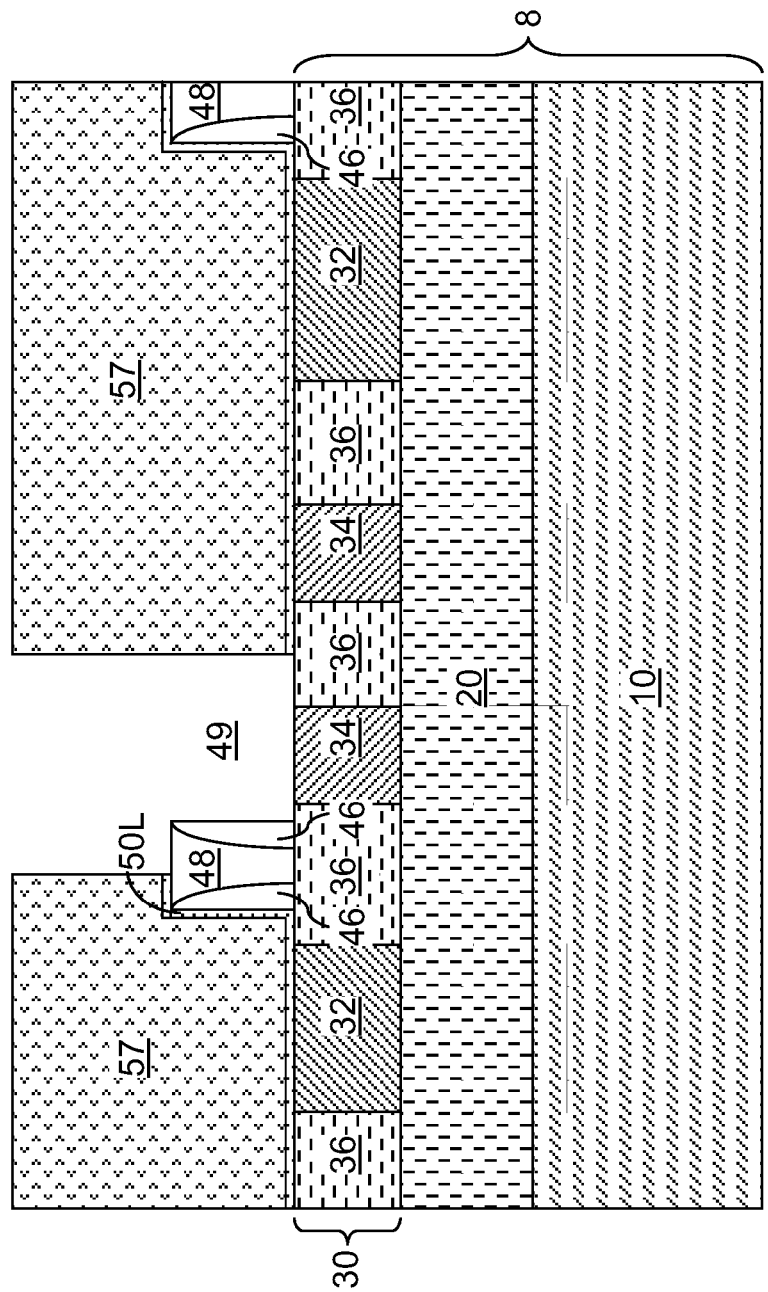

Referring to FIGS. 6A and 6B, a photoresist 57 is applied over the gate dielectric layer 50L and is lithographically patterned to form at least one opening therein. The openings in the photoresist 57 are formed in locations at which an electrical contact between a gate electrode and an underlying active region is desired.

The exposed portions of the gate dielectric layer 50L are etched, for example, by a wet etch, employing the photoresist 57 as an etch mask. For each gate cavity 49 over which an opening in the photoresist 57 is formed, a sidewall of the photoresist can overlie a horizontal portion of the gate dielectric layer 50L at the bottom of the gate cavity 49 in direct contact with the semiconductor layer 30. Thus, a portion of the gate dielectric layer 50L within the gate cavity 49 can be exposed to etchants, and the remaining portion of the gate dielectric layer 50L within the gate cavity 49 can be covered by the photoresist 57.

A portion of the gate dielectric layer 50L can be removed within the gate cavity 49 from above one of the at least one active region (32, 34). In one embodiment, after the optional removal of the portion of the gate dielectric layer 50L, electrical dopants can be implanted through the patterned photoresist 57 before the patterned photoresist 57 is stripped. The species of the implanted electrical dopants can be boron for forming contacts to p-type field effect transistors (PFETs), and can be phosphorus or arsenic for n-type field effect transistors (NFETs). In one embodiment, the removed portion of the gate dielectric layer 50L can overlie a portion of the second active region 34 and does not overlie any portion of the first active region 32, or vice versa. For example, in the case of an SRAM cell, the openings in the photoresist 57 can be formed in the portions of the second active regions 34 that correspond to the drain of a p-type field effect transistor. For the SRAM cell, openings in the gate dielectric layer 50L are formed only over some portions of the second active regions 34 and shallow trench isolation structures 36 in the immediate vicinity thereof, but are not formed over any first active region 32. In the exemplary case of an SRAM cell, the dopant that is implanted into the area of the opening from which the portions of the gate dielectric layer 50L are removed can be boron.

Figure 7A:
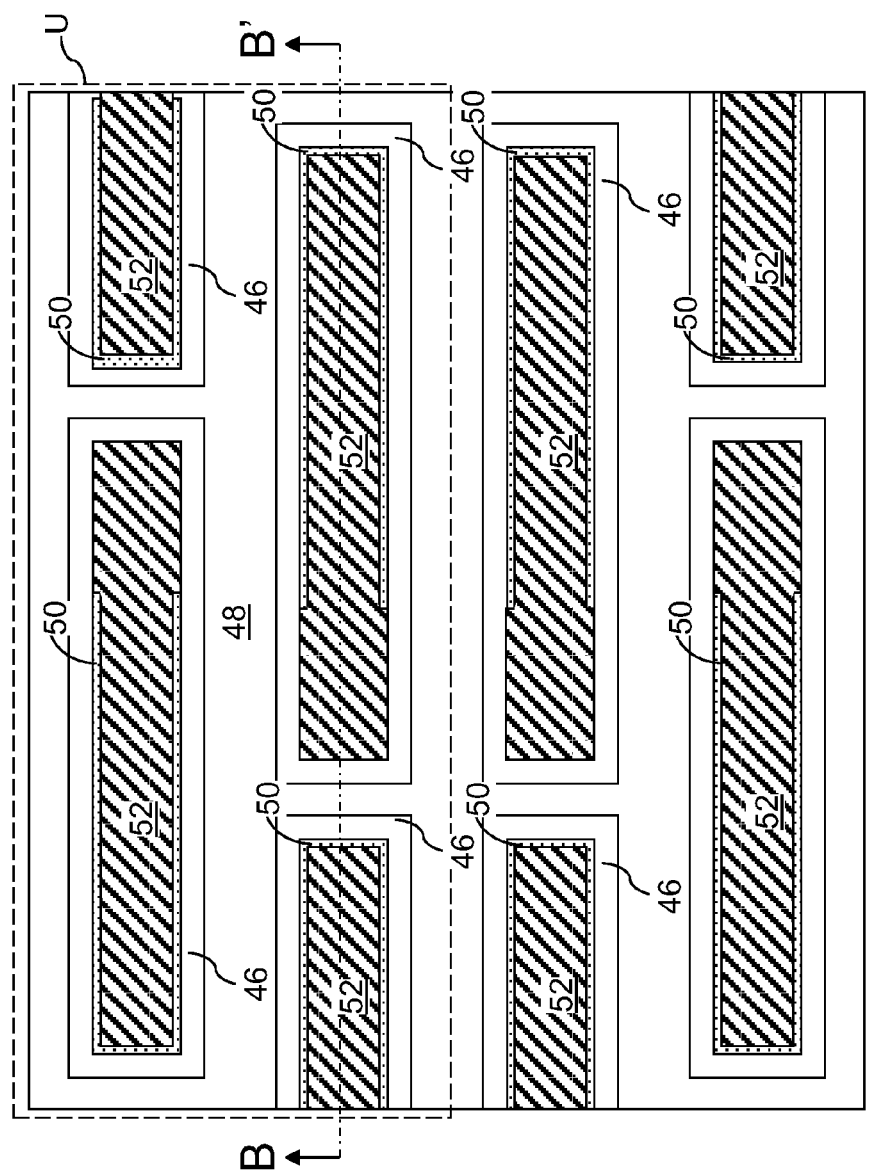
FIGS. 7A and 7B illustrate the first exemplary semiconductor structure after formation of gate conductors according to the first embodiment of the present disclosure.
Figure 7B:
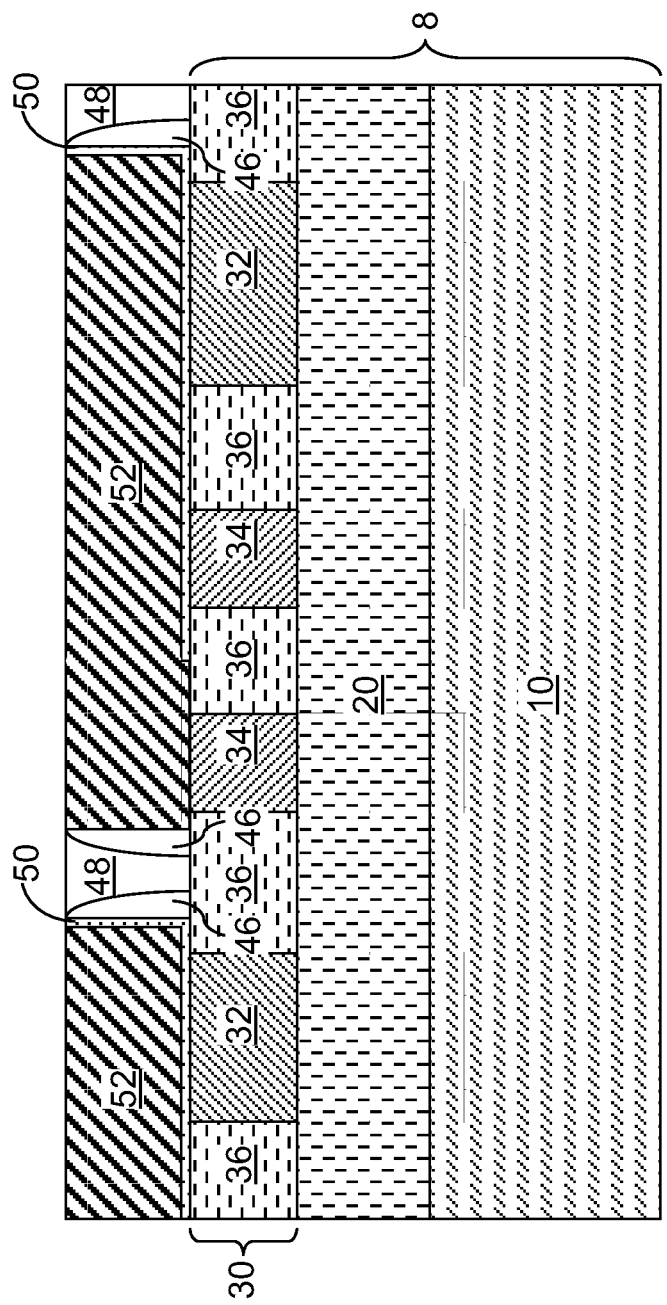

Referring to FIGS. 7A and 7B, gate conductors 52 are formed by filling the gate cavities 49 with a conductive material and removing excess conductive materials above the top surface of the planarization dielectric layer 48. The excess conductive material is planarized, for example, by chemical mechanical planarization (CMP), recess etch, or a combination thereof. Depending on embodiments, the horizontal portion of the gate conductor layer 50L above the top surface of the planarization dielectric layer 48 may, or may not, be removed. Optionally, multiple metallic materials can be employed to fill the gate cavities 49. In addition or alternately, different portions of gate cavities 49 may be filled with different metallic materials so that p-type field effect transistors and n-type field effect transistors are provided with different work function metals contacting the remaining portions of the gate dielectric layer 50L, which are herein referred to as gate dielectric 50.

The gate conductors 52 can include a metallic material or a doped semiconductor material that contacts the gate dielectrics 50. The doped semiconductor material can include a doped elemental semiconductor material such as doped silicon or doped germanium, a doped alloy of at least two elemental semiconductor materials, a doped compound semiconductor material, a doped alloy of at least two compound semiconductor materials, a combination thereof, and an alloy thereof. The metallic material can include, but is not limited to, Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, TiAl, TaN, a stack thereof, a conductive oxide thereof, a conductive nitride thereof, an alloy thereof, and a combination thereof.

Each gate conductor 52 is formed as a structure of unitary construction, i.e., a contiguous structure formed as a single piece and not divided into multiple disjoined parts.

Each gate dielectric 50 contacts the semiconductor material of at least one of the first and second active regions (32, 34). The first exemplary semiconductor structure can include at least one gate conductor 52 which fills a gate cavity 49 in which an opening in the gate dielectric 50 is not present. Such a gate conductor 52 does not contact any semiconductor material of the first and second active regions (32, 34).

The first exemplary semiconductor structure can further include at least another gate conductor which fills a gate cavity 49 in which an opening in the gate dielectric 50 is present. Such a gate conductor 52 contacts at least one semiconductor surface of the first and/or second active regions (32, 34). In this case, the gate conductor 52 includes at least a first gate conductor portion that overlies the gate dielectric 50 and a second gate conductor portion that contacts a semiconductor surface. The gate dielectric 50 overlies an active region, which can be a first active region 32 or a second active region 34. The semiconductor surface can be a surface of the same active region underlying the gate dielectric 50 or a surface of another active region located in the semiconductor substrate 8.

In one embodiment, a first active region 32 and a second active region 34 can be laterally spaced by a shallow trench isolation structure 36 therebetween. In this case, a gate conductor 52 thereabove can be vertically spaced from the first active region 32 by a gate dielectric 50, and can contact the semiconductor surface of the second active region 34.

Each gate dielectric 50 includes at least one horizontal portion and at least one vertical portion. Each horizontal portion has a bottom surface that contacts at least one portion of the first and/or second active regions (32, 34). Each vertical portion vertically extends above a top surface of the at least one horizontal portion along the inner sidewalls of a gate spacer 46 to the topmost surface of the planarization dielectric layer. For each gate conductor 52 filling a gate cavity 49 including at least one opening in the gate dielectric 50 underneath, an outer sidewall of a vertical portion of the gate dielectric 50 can be in the same vertical plane as a sidewall of a portion of the gate conductor 52 that directly contacts an inner sidewall of a gate spacer 46 in the region of the at least one opening in the gate dielectric 50.

For example, a gate conductor 52 can be vertically spaced from a semiconductor surface of a first active region 32 by a gate dielectric 50, contact another semiconductor surface of a second active region 34, and be vertically spaced from the shallow trench isolation structure 36 between the first active region 32 and the second active region by the gate dielectric 50. Further, additional intervening active region(s) (32, 34) may be placed between the first active region 32 and the second active region 34.

If the first exemplary semiconductor structure includes an SRAM cell, as illustrated in FIG. 7B, a gate conductor 52 can be vertically spaced from a semiconductor surface of a first active region 32 by a gate dielectric 50, be vertically spaced from another semiconductor surface of a second active region 34 by the gate dielectric 50, be vertically spaced from a shallow trench isolation structure located between the first active region 32 and the second active region 34 by the gate dielectric 50, contact yet another semiconductor surface of another second active region 34, be vertically spaced from a portion of a shallow trench isolation structure 36 located between the two second active regions 34, and contact a top dielectric surface of another portion of the shallow trench isolation structure 36 located between the two second active regions 34. The portion of the first active region 32 is a drain region of an n-type field effect transistor in the SRAM cell, and the yet another semiconductor surface of another second active region 34 can be the portion of that second active region 34 which is a drain region of a p-type field effect transistor in the SRAM cell. An end portion of the gate conductor 52 contacts the drain region of the p-type field effect transistor.

The permutations of contact or separation from underlying semiconductor surfaces of active regions (32, 34) and underlying dielectric surfaces of shallow trench isolation structures 36 depend on the type and design of the semiconductor device within the first exemplary semiconductor structure.

Figure 8A:
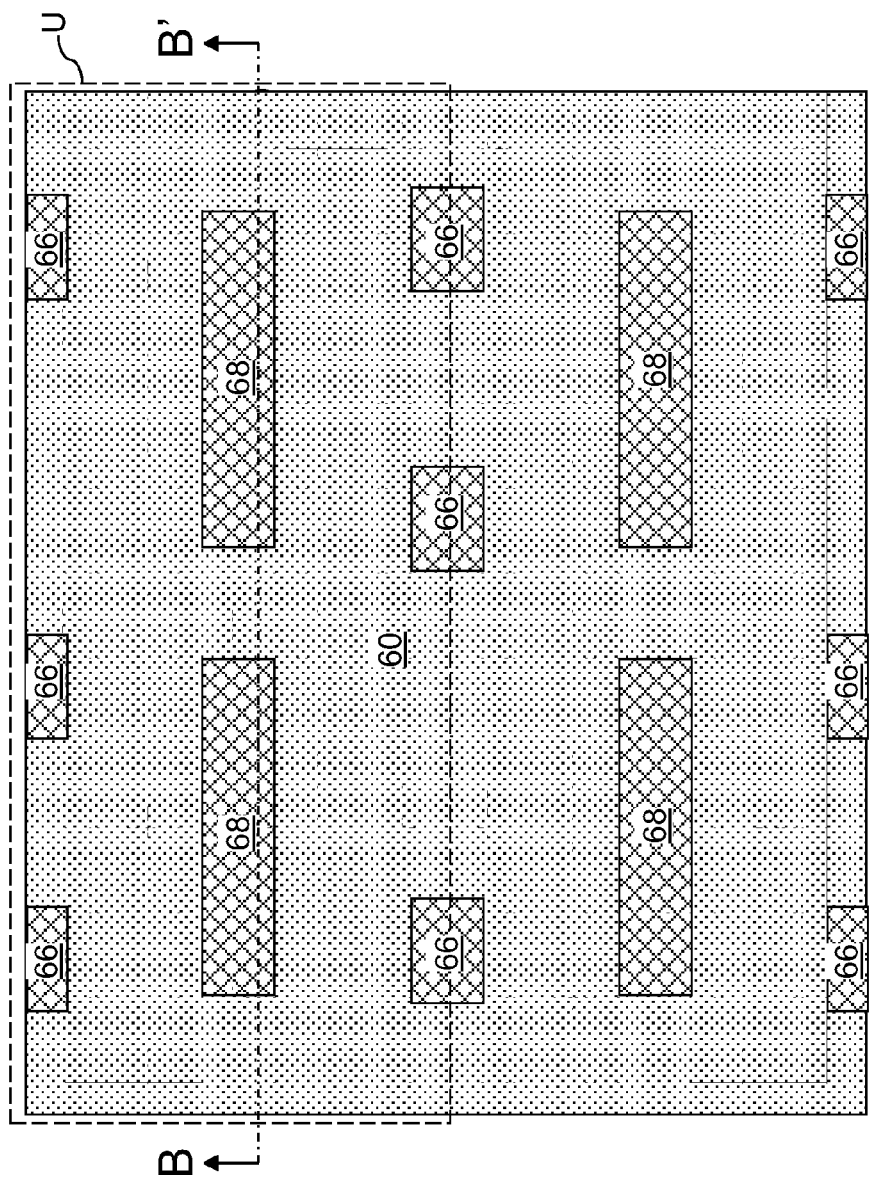
FIGS. 8A and 8B illustrate the first exemplary semiconductor structure after formation of a gate cap dielectric layer and local interconnect structures according to the first embodiment of the present disclosure.
Figure 8B:
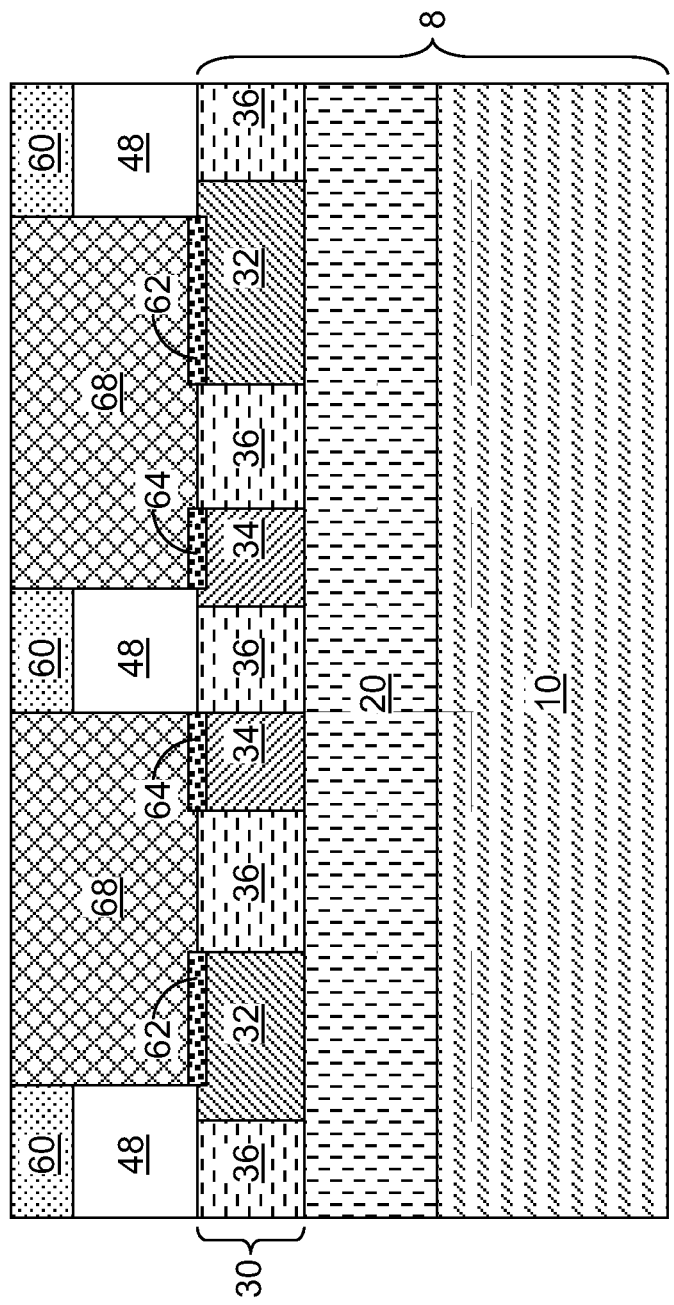

Referring to FIGS. 8A and 8B, a gate cap dielectric layer 60 is deposited, for example, by chemical vapor deposition (CVD). The gate cap dielectric layer 60 includes a dielectric material such as silicon oxide, silicon nitride, a doped silicate glass, organosilicate glass, or a combination thereof. The thickness of the gate cap dielectric layer 60 can be from 10 nm to 200 nm, although lesser and greater thicknesses can also be employed.

Local interconnect structures 68 and contact via structures 66 are formed through the gate cap dielectric layer 60 and the planarization dielectric layer 48, for example, by applying a photoresist (not shown) on the top surface of the gate cap dielectric layer 60, lithographically patterning the photoresist to form various openings therein, transferring, employing an etch such as an anisotropic etch, the pattern in the photoresist through the underlying stack of the gate cap dielectric layer 60 and the planarization dielectric layer 48, depositing a conductive material within the cavities in the gate cap dielectric layer 60 and the planarization dielectric layer 48, and removing the excess conductive material from above the gate cap dielectric layer 60 by planarization such as chemical mechanical planarization. The lithographic patterning and pattern transfer can be performed employing a single lithographic process and a single etch process, or can be performed employing multiple photoresists and/or multiple etch processes.

FIG. 8A shows that each contact via structure 66 contacts a semiconductor surface which corresponds to a single node of a semiconductor device, and each local interconnect structure 68 contacts a plurality of semiconductor surfaces which correspond to multiple nodes of at least one semiconductor device. Metal semiconductor alloy regions (62, 64) can be optionally formed at the bottom surface(s) of each local interconnect structure 68 and each contact via structure 66 by reacting a metal layer with an underlying semiconductor material prior to depositing the conductive material(s) of the local interconnect structures 68 and/or the contact via structures 66.

Figure 9A:
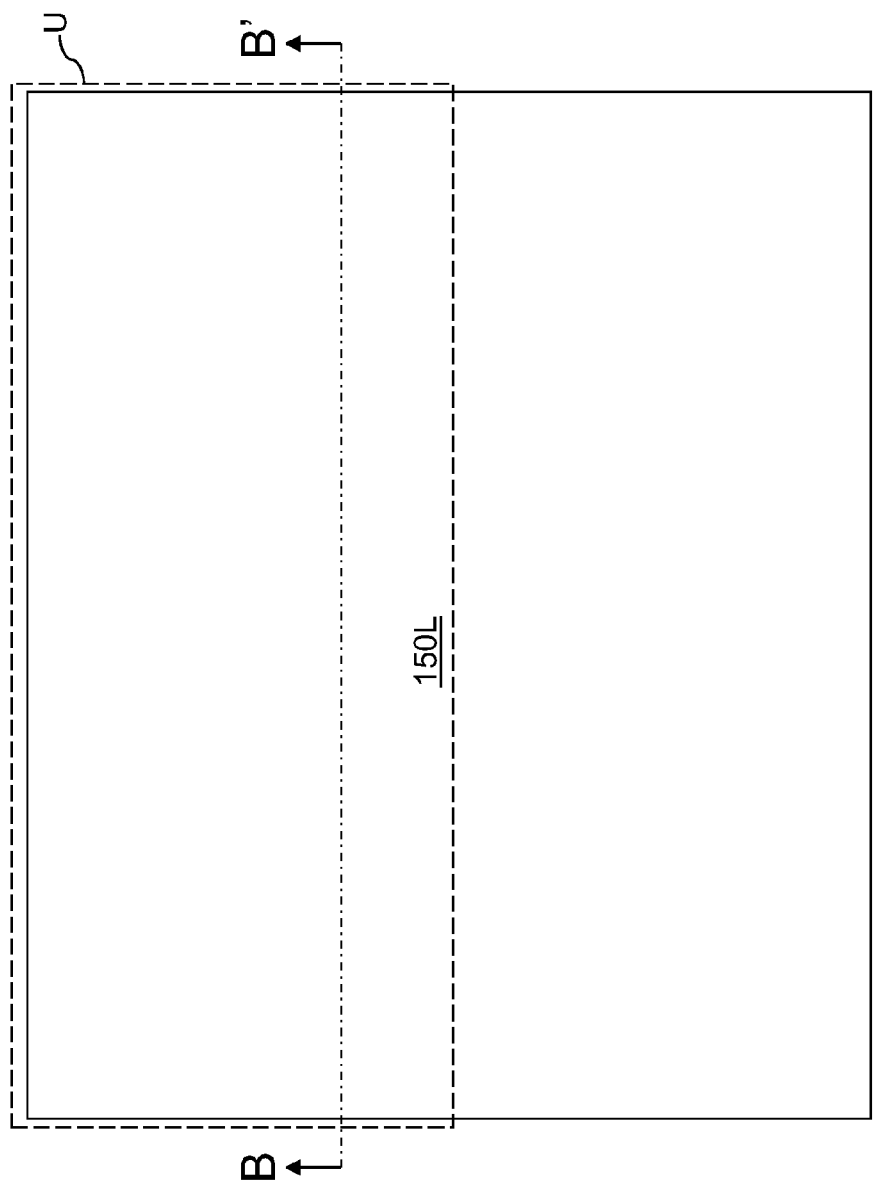
FIGS. 9A and 9B illustrate a second exemplary semiconductor structure after formation of a gate dielectric layer according to a second embodiment of the present disclosure.
Figure 9B:
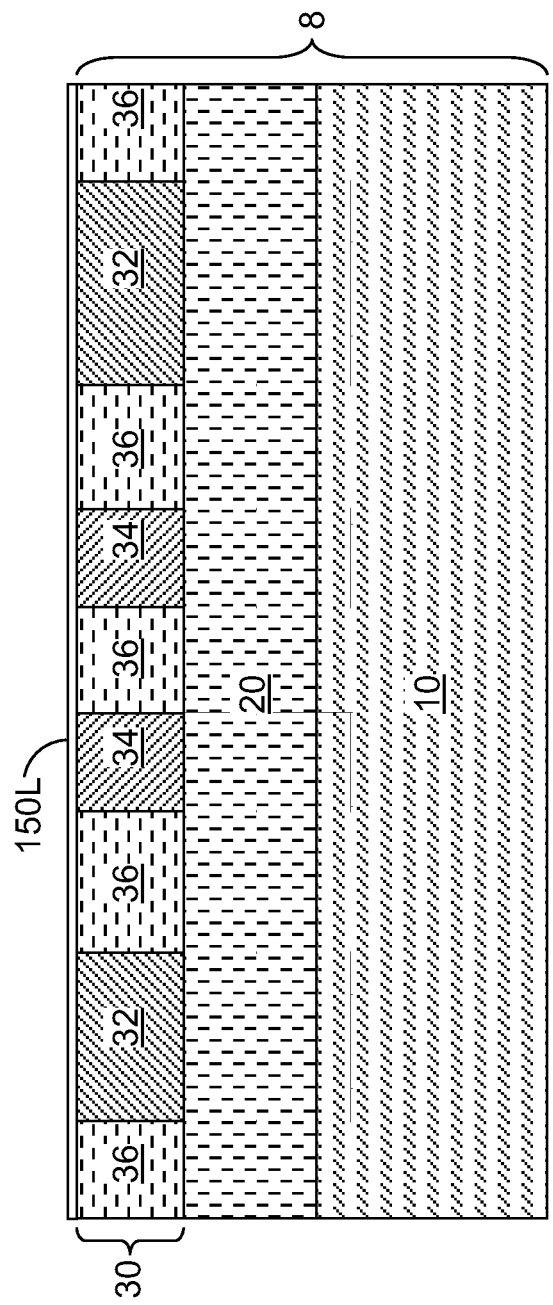

Referring to FIGS. 9A and 9B, a second exemplary semiconductor structure according to a second embodiment of the present disclosure can be derived from the first exemplary semiconductor structure of FIGS. 1A and 1B by depositing a gate dielectric layer 150L on the top surface of the semiconductor layer 30, which includes first and second active regions (32, 34) and shallow trench isolation structures 36. The top surfaces of the first and second active regions (32, 34) and shallow trench isolation structures 36 can be substantially coplanar among one another.

In one embodiment, the gate dielectric layer 150L can be a dielectric material including at least one metal and oxygen, and can have the same composition and thickness as, and be deposited employing the same methods as, the gate dielectric layer 50L in the first embodiment. In this embodiment, the gate dielectric layer 150L is a single contiguous layer without any opening therein, and contacts all top surfaces of the first and second active regions (32, 34) and shallow trench isolation structures 36.

In another embodiment, the gate dielectric layer 150L can be selectively formed on the semiconductor surfaces of the first and second active regions (32, 34) by conversion of the semiconductor material of the first and second active regions (32, 34) into a dielectric material by oxidation, nitridation, or a combination thereof. The conversion process can be a thermal process, a plasma process, or a combination thereof. For example, the gate dielectric layer 150L can include silicon oxide, silicon nitride, and/or silicon oxynitride that can be formed by thermal oxidation, thermal nitridation, plasma oxidation, plasma nitridation, or a combination thereof. In this embodiment, the gate dielectric layer 150L is not formed on the dielectric surfaces of the shallow trench isolation structures 36, and may include a plurality of disjoined portions that do not contact one another.

In yet another embodiment, the gate dielectric layer 150L can include a combination of a first dielectric material derived from thermal and/or plasma conversion of the semiconductor material of the first and second active regions (32, 34) and a dielectric material including at least one metal and oxygen.

Figure 10A:
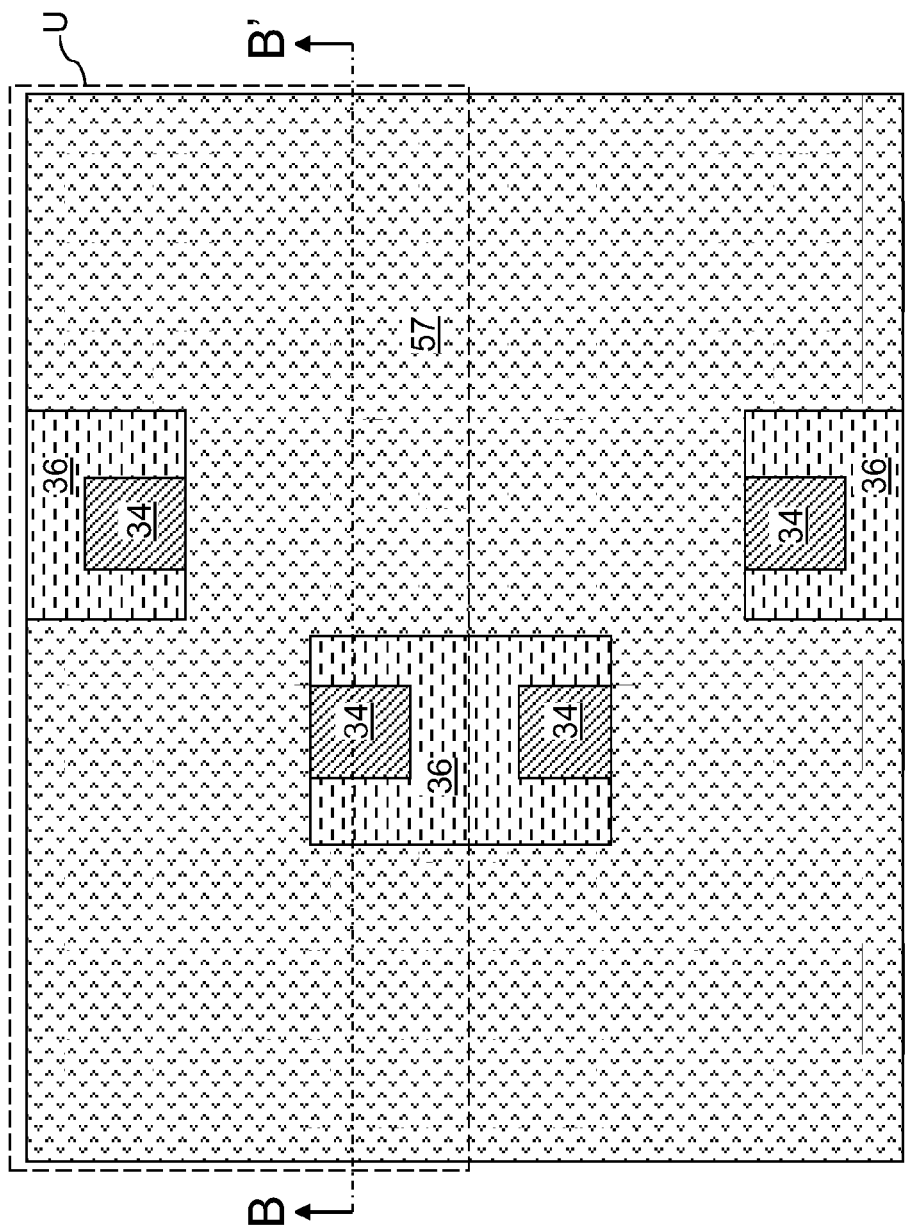
FIGS. 10A and 10B illustrate the second exemplary semiconductor structure after formation of openings in the gate dielectric layer according to the second embodiment of the present disclosure.
Figure 10B:
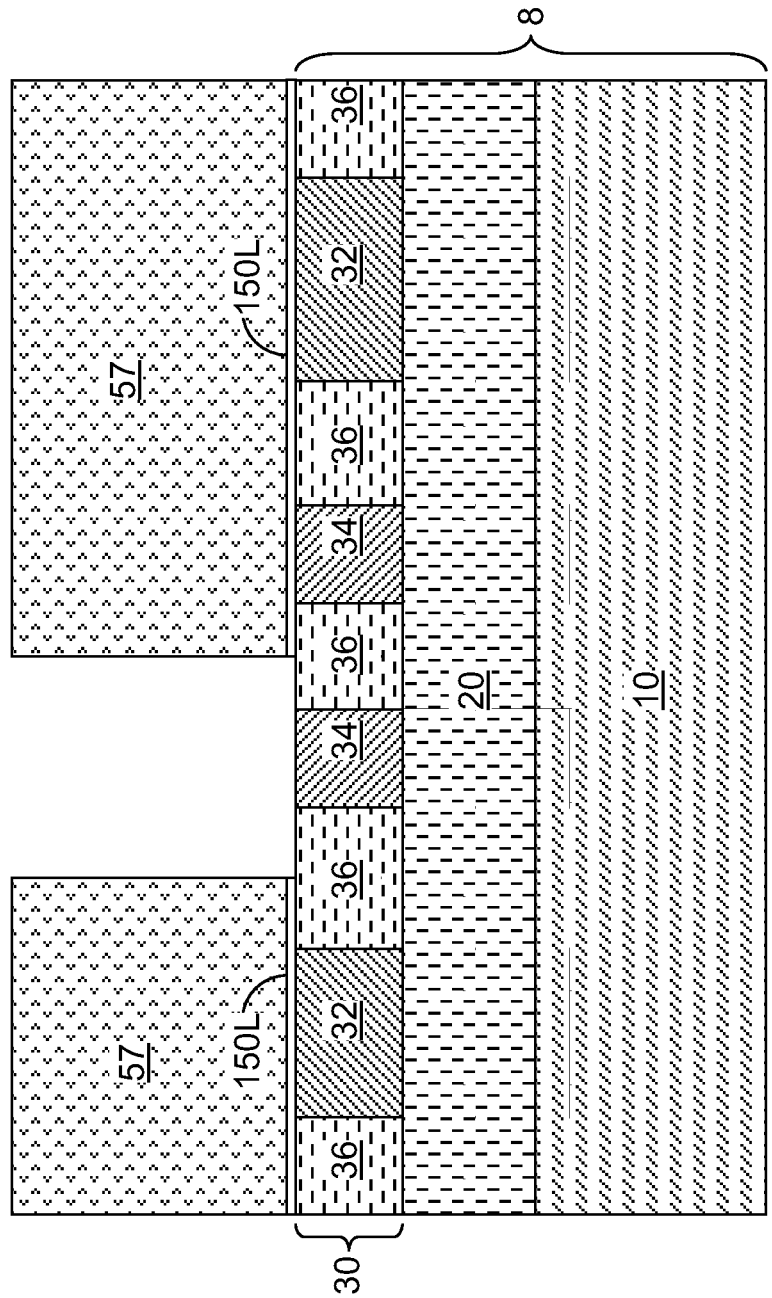

Referring to FIGS. 10A and 10B, a photoresist 57 is applied over the gate dielectric layer 150L and is lithographically patterned to form at least one opening therein. The openings in the photoresist 57 are formed in locations at which an electrical contact between a gate electrode and an underlying active region is desired. The exposed portions of the gate dielectric layer 150L are etched, for example, by a wet etch, employing the photoresist 57 as an etch mask. In one embodiment, electrical dopants can be implanted through the patterned photoresist 57 after removal of portions of the gate dielectric layer 150L and before stripping of the patterned photoresist 57. In one embodiment, the species of the implanted electrical dopants can be boron for forming contacts to p-type field effect transistors (PFETs), and phosphorus or arsenic for n-type field effect transistors (NFETs).

A portion of the gate dielectric layer 150L is optionally removed from above one of the at least one active region (32, 34). In one embodiment, the optionally removed portion of the gate dielectric layer 150L can overlie a portion of the second active region 34 and does not overlie any portion of the first active region 32, or vice versa. For example, in the case of an SRAM cell, the openings in the photoresist 57 can be formed in the portions of the second active regions 34 that correspond to the drain of a p-type field effect transistor. For the SRAM cell, openings in the gate dielectric layer 150L are formed only over some portions of the second active regions 34 and shallow trench isolation structures 36 in the immediate vicinity thereof, but are not formed over any first active region 32. In the exemplary case of an SRAM cell, the dopant that is implanted into the area of the opening from which the portions of the gate dielectric layer 50L are removed can be boron.

Figure 11A:
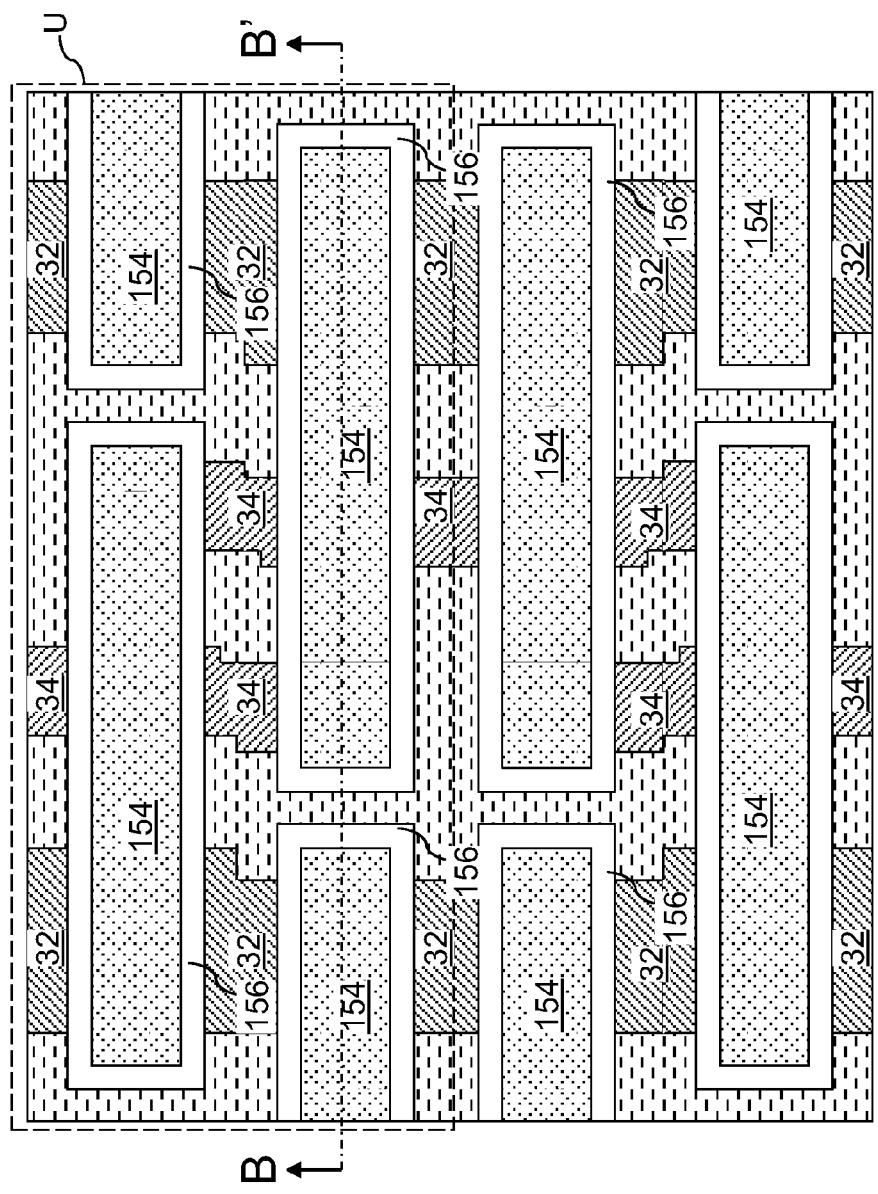
FIGS. 11A and 11B illustrate the second exemplary semiconductor structure after formation of gate conductors and dielectric gate spacers according to the second embodiment of the present disclosure.
Figure 11B:
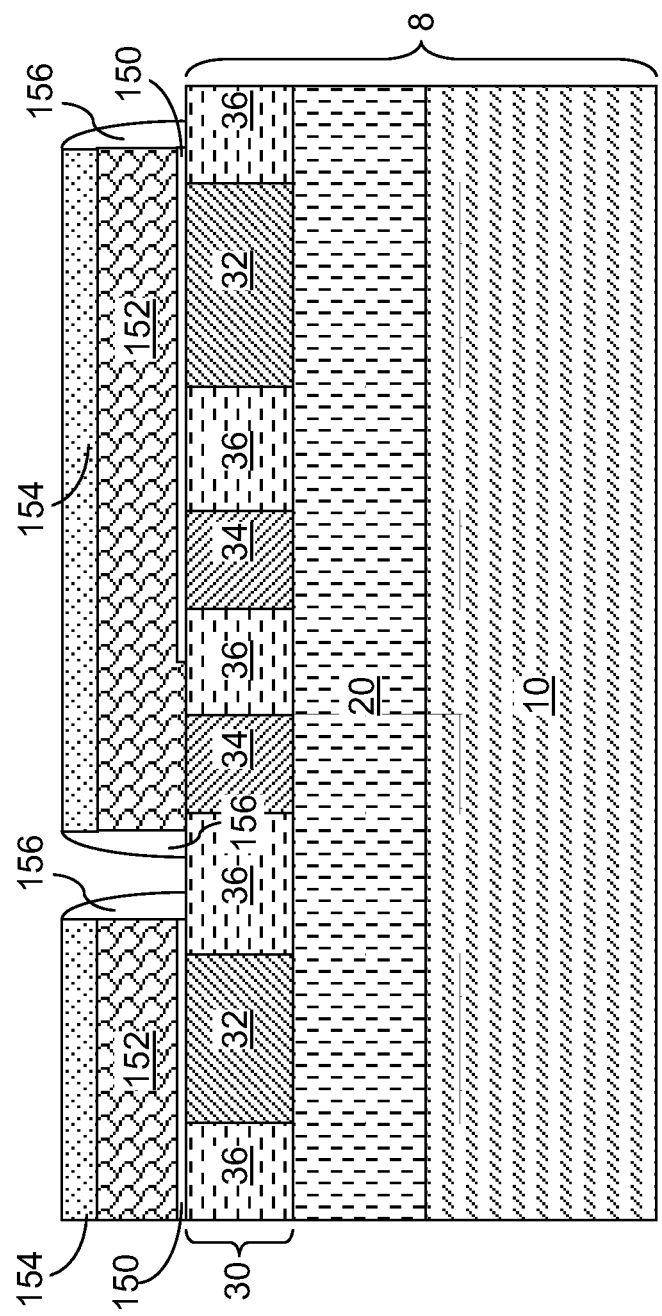

Referring to FIGS. 11A and 11B, gate stacks and gate spacers 156 are formed on the semiconductor substrate 8. Specifically, a gate conductor layer including at least one conductive material and a gate cap layer including a dielectric material are deposited as blanket layers, for example, by chemical vapor deposition (CVD), physical vapor deposition (PVD), or any other deposition methods known in the art. The at least one conductive material of the gate conductor layer can be any material that can be employed for the gate conductors 152 of the first embodiment. The dielectric material of the gate cap layer can be, for example, silicon oxide, silicon nitride, silicon oxynitride, or a combination thereof. The thickness of the gate conductor layer can be from 30 nm to 300 nm, although lesser and greater thicknesses can also be employed. The thickness of the gate cap layer can be from 20 nm to 200 nm, although lesser and greater thicknesses can also be employed.

The gate conductor layer is vertically spaced from the surfaces of the first and second active regions (32, 34) and shallow trench isolation structures 36 by the gate dielectric layer 150L wherever the gate dielectric layer 150L is present. However, the gate conductor layer contacts the semiconductor surfaces of the first and/or second active regions (32, 34) and/or the dielectric surfaces of the shallow trench isolation structures wherever the gate dielectric layer 150L is not present, i.e., in areas of the openings in the gate dielectric layer 150L.

A photoresist (not shown) is applied over the gate cap layer and is lithographically patterned. The pattern in the photoresist is transferred through the gate cap layer and the gate conductor layer, and optionally through the gate dielectric layer 150L. The remaining portions of the gate cap layer, gate conductor layer, and gate dielectric layer 150L constitute gate stacks. Each gate stack includes a stack of a gate dielectric 150, a gate conductor 152, and a gate cap 154. Each gate dielectric 150 is a remaining portion of the gate dielectric layer 150L, each gate conductor 152 is a remaining portion of the gate conductor layer, and each gate cap 154 is a remaining portion of the gate cap layer.

Each gate conductor 152 is formed as a structure of unitary construction. Each gate dielectric 150 contacts the semiconductor material of at least one of the first and second active regions (32, 34). The second exemplary semiconductor structure can include at least one gate conductor 152 which does not overlie any opening in the gate dielectric 150. Such a gate conductor 152 does not contact any semiconductor material of the first and second active regions (32, 34).

The second exemplary semiconductor structure can further include at least another gate conductor which overlies, partly of fully, an opening in the gate dielectric 150. Such a gate conductor 152 contacts at least one semiconductor surface of the first and/or second active regions (32, 34). In this case, the gate conductor 152 includes at least a first gate conductor portion that overlies the gate dielectric 150 and a second gate conductor portion that contacts a semiconductor surface. The gate dielectric 150 overlies an active region, which can be a first active region 32 or a second active region 34. The semiconductor surface can be a surface of the same active region underlying the gate dielectric 150 or a surface of another active region located in the semiconductor substrate 8.

In one embodiment, a first active region 32 and a second active region 34 can be laterally spaced by a shallow trench isolation structure 36 therebetween. In this case, a gate conductor 152 thereabove can be vertically spaced from the first active region 32 by a gate dielectric 150, and can contact the semiconductor surface of the second active region 34.

Each gate dielectric 150 contacts at least one portion of the first and/or second active regions (32, 34). If the gate dielectric layer 150L is formed as a single contiguous layer contacting the top surfaces of the shallow trench isolation structures 36, a gate conductor 152 can be vertically spaced from a semiconductor surface of a first active region 32 by a gate dielectric 150, contact another semiconductor surface of a second active region 34, and be vertically spaced from the shallow trench isolation structure 36 between the first active region 32 and the second active region by the gate dielectric 150. If the gate dielectric layer 150L is formed only on the semiconductor surfaces of the first and second active regions (32, 34) and is not formed on the top surfaces of the shallow trench isolation structures 36, a gate conductor 152 can be vertically spaced from a semiconductor surface of a first active region 32 by a gate dielectric 150, contact another semiconductor surface of a second active region 34, and contact the shallow trench isolation structure 36 between the first active region 32 and the second active region. Further, additional intervening active region(s) (32, 34) may be placed between the first active region 32 and the second active region 34.

If the second exemplary semiconductor structure includes an SRAM cell, as illustrated in FIG. 11B, a gate a conductor 152 can be vertically spaced from a semiconductor surface of a first active region 32 by a gate dielectric 150, be vertically spaced from another semiconductor surface of a second active region 34 by the gate dielectric 150, be vertically spaced from a shallow trench isolation structure located between the first active region 32 and the second active region by the gate dielectric 150, contact yet another semiconductor surface of another second active region 34, be vertically spaced from a portion of a shallow trench isolation structure 36 located between the two second active regions 34, and contact a top dielectric surface of another portion of the shallow trench isolation structure 36 located between the two second active regions 34. The portion of the first active region 32 is a drain region of an n-type field effect transistor in the SRAM cell, and the yet another semiconductor surface of another second active region 34 can be the portion of that second active region 34 which is a drain region of a p-type field effect transistor in the SRAM cell. An end portion of the gate conductor 152 contacts the drain region of the p-type field effect transistor.

The permutations of contact or separation from underlying semiconductor surfaces of active regions (32, 34) and underlying dielectric surfaces of shallow trench isolation structures 36 depend on the type and design of the semiconductor device within the second exemplary semiconductor structure.

Dopants may be implanted into various portions of the first and second active regions (32, 34) by masked ion implantation to form source/drain extension regions (not shown) and/or halo regions (not shown) within the first and second active regions (32, 34) to enhance device performance. A gate spacer 156 including a dielectric material is formed around each gate stack (150, 152, 154) by conformally depositing a dielectric material layer and removing horizontal portions of the dielectric material layer by an anisotropic etch. The remaining vertical portions of the conformal dielectric material layer constitute the gate spacers 156. The dielectric material of the gate spacers 156 can be, for example, silicon oxide, silicon nitride, silicon oxynitride, or a combination thereof. While a single gate spacer is illustrated as the gate spacers 156 in the drawings, each gate spacer 156 can be formed as a set of a plurality of component gate spacers (not shown), which can have the same composition thereamongst or different compositions thereamongst. After each formation of a component gate spacer, dopants of appropriate types can be implanted employing masked ion implantation to form source/drain extension regions (not shown) or source/drain regions (not shown).

Figure 12A:
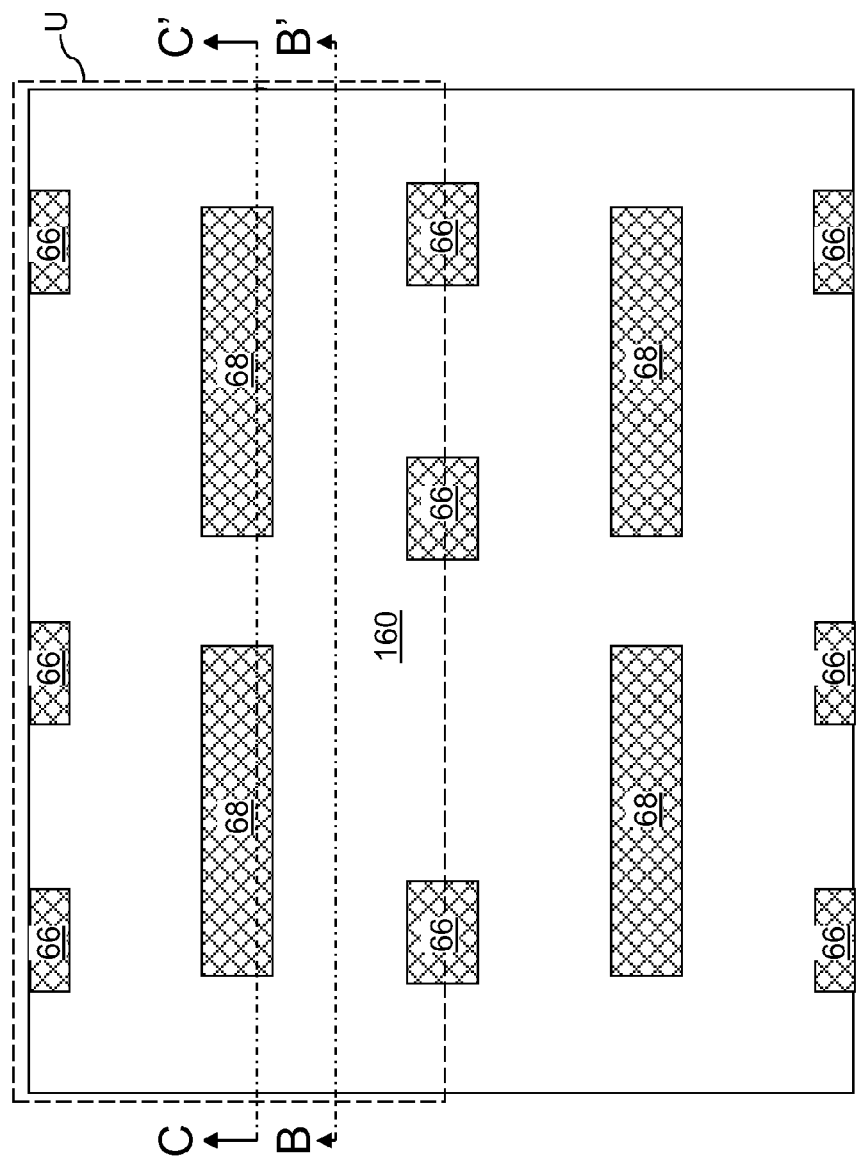
FIGS. 12A, 12B, and 12C illustrate the second exemplary semiconductor structure after formation of a gate cap dielectric layer and local interconnect structures according to the second embodiment of the present disclosure.
Figure 12B:
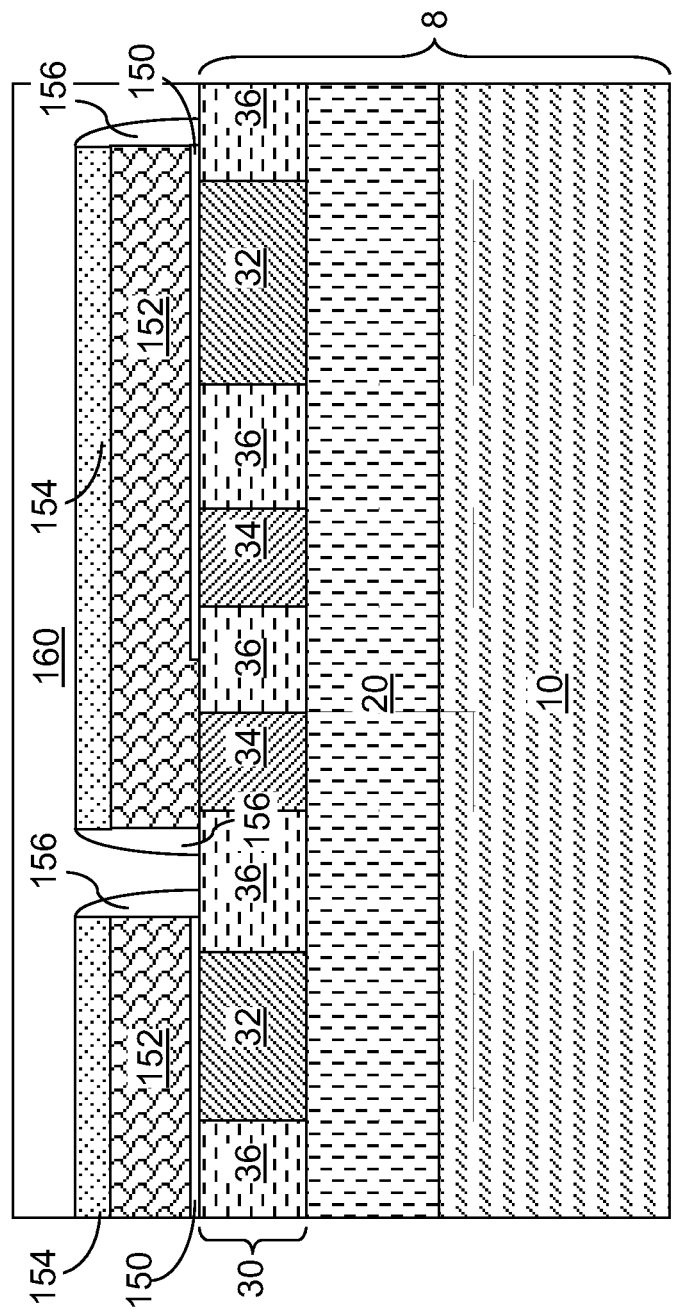
Figure 12C:
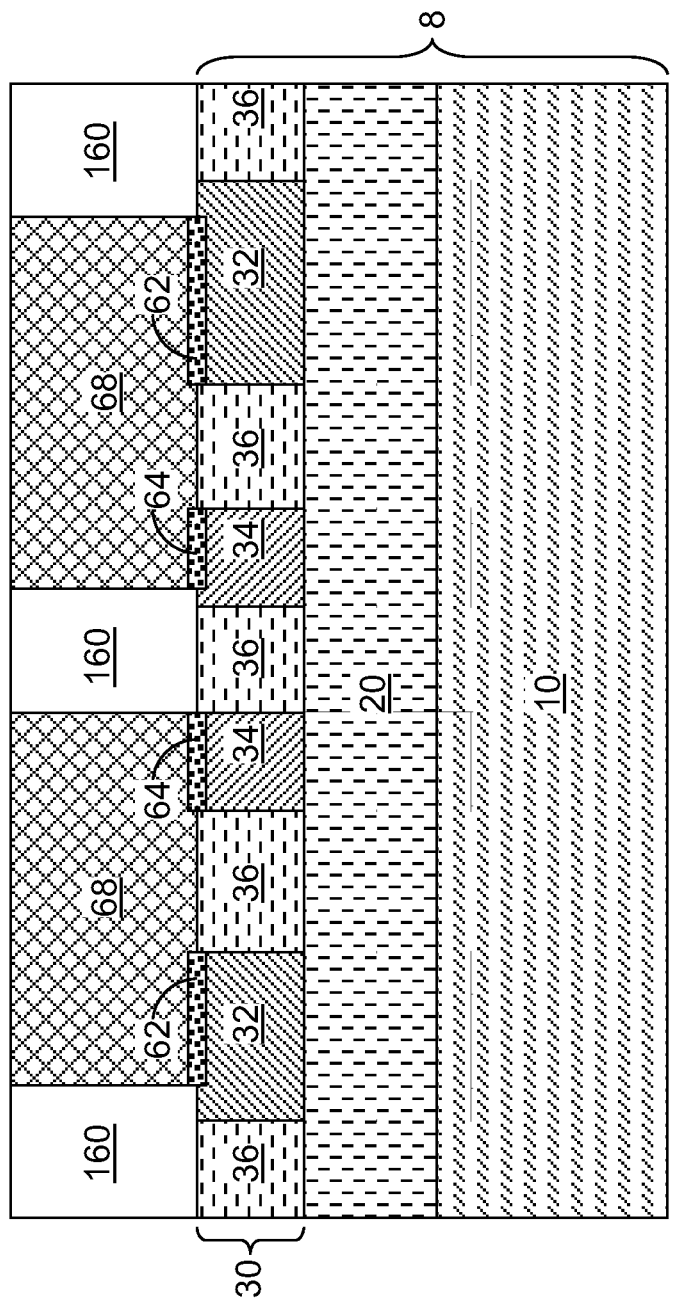

Referring to FIGS. 12A-12C, a contact level dielectric layer 160 is deposited, for example, by chemical vapor deposition (CVD). The contact level dielectric layer 160 includes a dielectric material such as silicon oxide, silicon nitride, a doped silicate glass, organosilicate glass, or a combination thereof. The contact level dielectric layer 160 is planarized, for example, by chemical mechanical planarization (CMP). The thickness of the contact-level dielectric layer 160, as measured after planarization from the top surface of the gate caps 154, can be from 10 nm to 200 nm, although lesser and greater thicknesses can also be employed.

Local interconnect structures 68 and contact via structures 66 are formed in through the contact level dielectric layer 160, for example, by applying a photoresist (not shown) on the top surface of the contact level dielectric layer 160, lithographically patterning the photoresist to form various openings therein, transferring, employing an etch such as an anisotropic etch, the pattern in the photoresist through the contact level dielectric layer 160, depositing a conductive material within the cavities in the contact level dielectric layer 160, and removing the excess conductive material from above the contact level dielectric layer 160 by planarization such as chemical mechanical planarization. The lithographic patterning and pattern transfer can be performed employing a single lithographic process and a single etch process, or can be performed employing multiple photoresists and/or multiple etch processes.

Each contact via structure 66 contacts a semiconductor surface that corresponds to a single node of a semiconductor device, and each local interconnect structure 68 contacts a plurality of semiconductor surfaces that correspond to multiple nodes of at least one semiconductor device. Metal semiconductor alloy regions (62, 64) can be optionally formed at the bottom surface(s) of each local interconnect structure 68 and each contact via structure 66 by reacting a metal layer with an underlying semiconductor material prior to depositing the conductive material(s) of the local interconnect structures 68 and/or the contact via structures 66.

The methods of the present disclosure illustrated with an SRAM cell with NFET passgate can also be applied to SRAM with PFET passgates which consist of complimentary devices. For example, complimentary devices can be formed by substituting an NFET for each PFET illustrated herein and by substituting a PFET for an NFET illustrated herein. The same method is also applicable to SRAM employing non-metal gate FETs.

Each embodiment of the methods of the present disclosure illustrated with an SRAM cell as an exemplary structure can also be employed for any semiconductor structure or device that requires formation of electrical contacts between any active region and a gate conductor. Such variations are expressly contemplated herein.

Each embodiment of the present disclosure can be employed for a semiconductor-on-insulator (SOI) substrate, a bulk Si substrate, and any substrate including any semiconductor material such as III-V compound semiconductor materials and II-VI compound semiconductor materials.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
   forming a gate cavity by removing a disposable gate structure selective to a planarization dielectric layer on a semiconductor substrate, wherein at least one surface of at least one active region and a portion of a shallow trench isolation structure are exposed within said gate cavity, wherein said at least one active region includes a first active region and a second active region that are laterally spaced by the shallow trench isolation structure;
   depositing a gate dielectric layer within said gate cavity on said exposed portion of the shallow trench isolation structure and on said exposed at least one surface of the at least one active region;
   removing a portion of said gate dielectric layer within said gate cavity from above said shallow isolation trench and another portion of said gate dielectric layer within said gate cavity from above one of said at least one active region, and implanting electrical dopant into an area of said semiconductor substrate from which the another portion of the said gate dielectric layer is removed; and
   filling said gate cavity with a conductive material and planarizing said conductive material to form a gate conductor, wherein the gate conductor contacts a gate dielectric, which is a remaining portion of said gate dielectric layer.

2. The method of claim 1, wherein said gate conductor fills an opening in the gate dielectric layer formed by the removing of the portion of said gate dielectric layer within said gate cavity from above said shallow isolation trench and the another portion of said gate dielectric layer within said gate cavity from above one of said at least one active region, and wherein said gate conductor contacts a semiconductor surface of said one of said at least one active region through the opening in the gate dielectric layer.

3. The method of claim 1, wherein said gate conductor is vertically spaced from said first active region by said gate dielectric and said semiconductor surface is a surface of said second active region.

4. The method of claim 1, wherein said portion of said gate dielectric layer and said another portion of said gate dielectric layer are is removed by:
   applying and lithographically patterning a photoresist over said gate dielectric layer; and
   etching said portion of said gate dielectric layer and said another portion of said gate dielectric layer which are exposed to etchants within said gate cavity, and a non-etched portion of said gate dielectric layer within said gate cavity is covered by said photoresist.

5. The method of claim 1, wherein said disposable gate structure is formed on said semiconductor substrate before depositing said planarization dielectric layer, and a top surface of said planarization dielectric layer is planarized before forming said gate cavity.

6. The method of claim 1, wherein said removed portion of said gate dielectric layer from above one of said at least one active region overlies a portion of said second active region and does not overlie any portion of said first active region.

7. The method of claim 1, wherein said semiconductor structure comprises a static random access memory (SRAM) cell, and an end portion of said gate conductor contacts a drain region of a field effect transistor.

8. A method of forming a semiconductor structure comprising:
   forming a gate dielectric layer over at least one active region in a semiconductor substrate, wherein said at least one active region includes a first active region and a second active region that are laterally spaced by a shallow trench isolation structure;
   removing a portion of said gate dielectric layer from above said shallow isolation trench and another portion of said gate dielectric layer from above one of said at least one active region, and implanting electrical dopant into an area of said semiconductor substrate from which the another portion of the said gate dielectric layer is removed; and
   depositing and patterning a conductive material layer to form a gate conductor, wherein said gate conductor contacts a gate dielectric, which is a remaining portion of said gate dielectric layer, and a semiconductor surface of said one of said at least one active region.

9. The method of claim 8, wherein said gate conductor is vertically spaced from said first active region by said gate dielectric and said semiconductor surface is a surface of said second active region.

10. The method of claim 8, wherein said gate dielectric layer is deposited on all top surfaces of said at least one active region and said shallow trench isolation structure.

11. The method of claim 8, wherein said removed portion of said gate dielectric layer from above one of said at least one active region overlies a portion of said second active region and does not overlie any portion of said first active region.

12. The method of claim 8, wherein said semiconductor structure comprises a static random access memory (SRAM) cell, and an end portion of said gate conductor contacts a drain region of a field effect transistor.

\* \* \* \* \*